(12) United States Patent
Usui

(10) Patent No.: US 11,280,119 B2
(45) Date of Patent: Mar. 22, 2022

(54) CONTACT SENSING DEVICE, PROXIMITY/CONTACT SENSING DEVICE, DOOR HANDLE DEVICE AND CONTROL METHOD OF THE DOOR HANDLE DEVICE, AND ELECTRONIC KEY SYSTEM

(71) Applicant: ROHM CO., LTD., Kyoto (JP)

(72) Inventor: Hirotoshi Usui, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 1324 days.

(21) Appl. No.: 15/219,699

(22) Filed: Jul. 26, 2016

(65) Prior Publication Data

US 2017/0030119 A1  Feb. 2, 2017

(30) Foreign Application Priority Data

Jul. 31, 2015 (JP) .............................. JP2015-151788
Jul. 31, 2015 (JP) .............................. JP2015-151790
Jun. 1, 2016 (JP) .............................. JP2016-110110

(51) Int. Cl.
*E05B 81/76* (2014.01)
*E05B 81/64* (2014.01)
(Continued)

(52) U.S. Cl.
CPC .............. *E05B 81/77* (2013.01); *E05B 47/00* (2013.01); *E05B 81/64* (2013.01); *E05B 81/78* (2013.01);
(Continued)

(58) Field of Classification Search
CPC .......... E05B 81/77; E05B 81/64; E05B 81/78; H03K 17/962; H03K 2217/96078;
(Continued)

(56) References Cited

U.S. PATENT DOCUMENTS 7,710,245 B2 * 5/2010 Pickering ............ B60R 25/2045
340/426.28
2005/0068712 A1 * 3/2005 Schulz .................... E05B 81/78
361/287

(Continued)

FOREIGN PATENT DOCUMENTS

JP  H05156851 A  6/1993
JP  2002295094 A  10/2002
(Continued)

OTHER PUBLICATIONS

JPO Notice of Reasons for Refusal for corresponding JP patent application No. 2016-110110; dated Mar. 17, 2020.

*Primary Examiner* — Jeff W Natalini
(74) *Attorney, Agent, or Firm* — Cantor Colburn LLP

(57) ABSTRACT

The door handle device includes: a contact sensing unit including a guide groove and a contact sensing electrode, the guide groove configured to guide a water droplet falling on a door, the contact sensing electrode disposed in the guide groove and configured to sense a contact with the door; a locking unit configured to execute unlocking and locking of a door; and a control unit configured to instruct to the locking unit to keep locking the door if determining that the water droplet is in contact with the door, on the basis of a sensing result by the contact sensing electrode. There are provided: a contact sensing device; a door handle device and a control method for such a door handle device; and an electronic key system, for preventing a misoperation due to a water droplet adhering to a door handle of vehicles, which has an electrostatic locking mechanism.

7 Claims, 27 Drawing Sheets

(51) Int. Cl.
*E05B 81/78* (2014.01)
*E05B 47/00* (2006.01)
*G07C 9/00* (2020.01)
*H03K 17/96* (2006.01)

(52) U.S. Cl.
CPC ....... *G07C 9/00309* (2013.01); *H03K 17/962* (2013.01); *E05B 2047/0056* (2013.01); *G07C 2009/00769* (2013.01); *G07C 2209/65* (2013.01); *H03K 2217/96078* (2013.01); *H03K 2217/960745* (2013.01); *H03K 2217/960755* (2013.01)

(58) Field of Classification Search
CPC .... H03K 2217/960745; G07C 2209/65; G01R 27/2605
See application file for complete search history.

(56) References Cited

U.S. PATENT DOCUMENTS

| | | | |
|---|---|---|---|
| 2008/0061933 A1 | 3/2008 | Ieda et al. | |
| 2011/0181387 A1* | 7/2011 | Popelard | B60R 25/246 340/5.2 |
| 2011/0254570 A1* | 10/2011 | Sage | H03K 17/9622 324/679 |
| 2016/0098877 A1* | 4/2016 | Tokudome | G07C 9/00944 340/5.72 |
| 2016/0138941 A1* | 5/2016 | Hirota | G07C 9/30 340/5.2 |
| 2016/0266717 A1* | 9/2016 | Oral | G06F 3/0418 |
| 2016/0318480 A1* | 11/2016 | Menard | G07C 9/00309 |

FOREIGN PATENT DOCUMENTS

| | | |
|---|---|---|
| JP | 2003221947 A | 8/2003 |
| JP | 2004340662 A | 12/2004 |
| JP | 2008069536 A | 3/2008 |
| JP | 2008108534 A | 5/2008 |
| JP | 2008309502 A | 12/2008 |
| JP | 2010048613 A | 3/2010 |
| JP | 2011017642 A | 1/2011 |
| JP | 2012026205 A | 2/2012 |
| JP | 2012154118 A | 8/2012 |
| JP | 2012154119 A | 8/2012 |
| JP | 2013113626 A | 6/2013 |
| JP | 2014122853 A | 7/2014 |
| WO | 2011024559 A1 | 3/2011 |

* cited by examiner

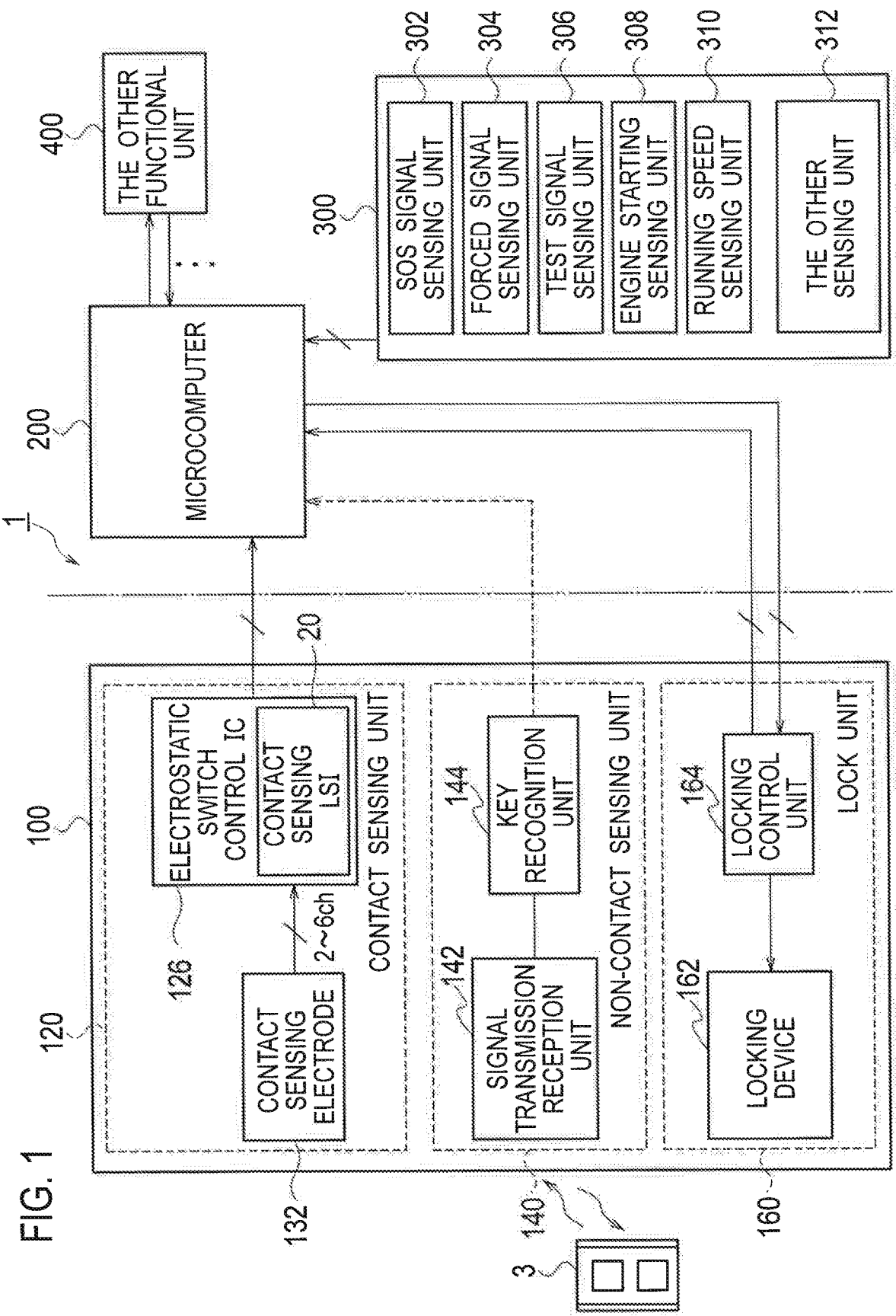

FIG. 16A
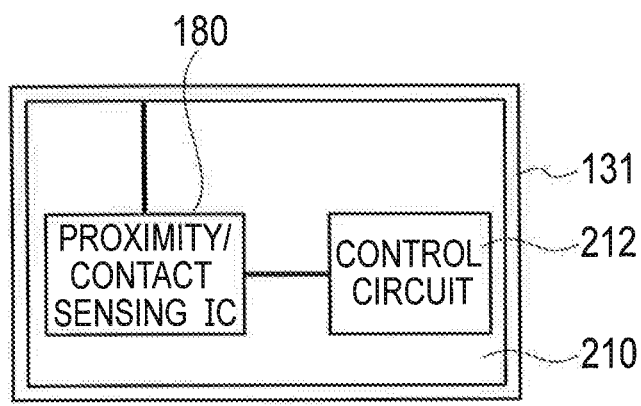
FIG. 16B
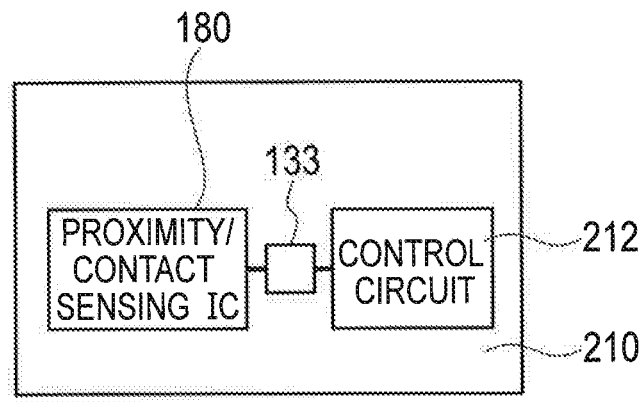
FIG. 16C
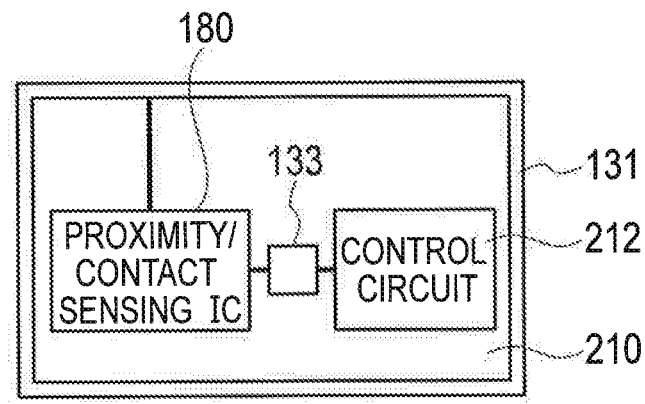
FIG. 17
| SENSING ELECTRODE | ARRANGEMENT PLACE | SENSITIVITY | AREA |
|---|---|---|---|
| FIRST ELECTRODE | OUTER PERIPHERY OF PCB | HIGH | WIDE |
| SECOND ELECTRODE | CENTER OF PCB | LOW | NARROW |

PATTERN [1] (FIRST ELECTRODE)

PATTERN [1] (SECOND ELECTRODE)

PATTERN [2] (FIRST ELECTRODE)

PATTERN [2] (SECOND ELECTRODE)

PATTERN [3] (FIRST ELECTRODE)

PATTERN [3] (SECOND ELECTRODE)

FIG. 27

| PATTERN NUMBER | OBJECT IN PROXIMITY/CONTACT | DETERMINATION | FINAL DETERMINATION |
|---|---|---|---|
| [1] | HUMAN | HUMAN IS IN PROXIMITY, AND THEN IS IN CONTACT, IN SITUATION WHERE IT IS NOT RAINING (WITH AN INTENTION OF UNLOCKING) | UNLOCKING |
| [2B] | HUMAN → WATER | ALTHOUGH HUMAN IS IN PROXIMITY, WATER IS ALSO IN CONTACT (WITHOUT INTENTION OF UNLOCKING) (DURING CAR WASHING) | LOCKING |
| [2] | WATER | HEAVY RAIN | LOCKING |
| [3] | WATER | LIGHT RAIN | LOCKING |
| [2]→[1] | HUMAN & WATER | HUMAN IS IN PROXIMITY, AND THEN IS IN CONTACT, IN HEAVY RAIN (WITH AN INTENTION OF UNLOCKING) | UNLOCKING |
| [3]→[1] | HUMAN & WATER | HUMAN IS IN PROXIMITY, AND THEN IS IN CONTACT, IN LIGHT RAIN (WITH AN INTENTION OF UNLOCKING) | UNLOCKING |
| [2B]→[1] | (HUMAN → WATER) → HUMAN | CAR WASHING IS COMPLETED, AND THEN HUMAN IS IN PROXIMITY/CONTACT (WITH AN INTENTION OF UNLOCKING) | UNLOCKING |

CONTACT SENSING DEVICE, PROXIMITY/CONTACT SENSING DEVICE, DOOR HANDLE DEVICE AND CONTROL METHOD OF THE DOOR HANDLE DEVICE, AND ELECTRONIC KEY SYSTEM

CROSS REFERENCE TO RELATED APPLICATIONS

This application is based upon and claims the benefit of priority from prior Japanese Patent Application Nos. 2015-151788 filed on Jul. 31, 2015, 2015-151790 filed on Jul. 31, 2015, and 2016-110110 filed on Jun. 1, 2016, the entire contents of which are incorporated herein by reference.

FIELD

The embodiments described herein relate to a contact sensing device, a proximity/contact sensing device, a door handle device and a control method for the same, and an electronic key system.

BACKGROUND

Lock used in houses, apartments, etc., and door locks used for vehicles, etc. can be opened and closed by wireless communications with keys, e.g. cards, smart phones, etc. Humans who carry such keys can open and close locks, without contacting doorknobs or door handles, i.e., without pulling out keys if the keys is carried.

Moreover, there have also been disclosed door handle devices for vehicles called a smart key system or a smart entry system using electrostatic capacity type lock sensor electrodes, unlocking sensor electrodes, etc.

SUMMARY

However, locks used in houses, or door locks used for vehicles may not be rather unpreferable to can be easily unlock.

For example, in door handle devices for vehicles called a smart key system or a smart entry system using electrostatic capacity type lock sensor electrodes, it is difficult to discriminate between adhesion of water droplets and human body contact since change of stray capacitances generated between a lock sensor electrode and human bodies is merely sensed. In such door handle devices for vehicles, if a water droplet which has the same degree of a relative permittivity ($\varepsilon s=80$) as that of human bodies is adhered to a portion used for determining a propriety whether the lock should be opened or closed (portion used for sensing change of the stray capacitance), the door lock will be released since it will discriminate that it is in a state where a human body is in contact therewith. As sources of such water droplets, raindrops at the time of rainfall, water streams at the time of car washing, etc. are listed, for example.

Thus, although contact/non-contact unlocking/locking can be realized with the popularization of smart phones, card keys, etc., it has been difficult to take countermeasures against misoperations in particular due to the rainfalls at the time of usage on the outdoors.

On the other hand, if complicating schemes in order to take the counter measure against misoperations, there are also problems that the complicated schemes can be fitted in a limited space of door handles etc., and a manufacturing cost also be increased.

The embodiments provide: a contact sensing device; a door handle device and a control method for such a door handle device; and an electronic key system, each for preventing a misoperation due to a water droplet adhering to a door handle, e.g. a vehicle, which has an electrostatic locking mechanism, etc.

The embodiments provide: a contact sensing device; a door handle device and a control method for such a door handle device; and an electronic key system, each for preventing a misoperation due to a water droplet adhering to a door handle, e.g. a vehicle, which has an electrostatic locking mechanism, etc., and also capable of reducing a fabricating cost.

According to one aspect of the embodiments, there is provided a contact sensing device comprising: a comparator unit disposed in a guide groove configured to guide a water droplet falling on a door, the comparator unit configured to compare a sensing result and a reference capacity value for calibration, the sensing result sensed by a contact sensing electrode configured to sense a contact with the door, the reference capacity value for calibration stored in a reference capacity setting memory; a sensing result determinating unit configured to determine whether or not something is in contact with the contact sensing electrode on the basis of a comparison result output from the comparator unit; and a determination unit configured to determine whether the water droplet is in contact with the contact sensing electrode or at least a part of a human body is in contact with the contact sensing electrode, on the basis of the sensing result and a threshold value, the threshold value stored in a threshold value setting memory.

According to another aspect of the embodiments, there is provided a proximity/contact sensing device comprising: a proximity/contact sensing electrode including a first electrode and a second electrode, the first electrode and the second electrode respectively formed so as to be values from which any one or both of an area and sensing sensitivity are different from each other, the proximity/contact sensing electrode configured to sense a proximity or contact to a door; a comparator unit configured to compare a sensing result sensed by the proximity/contact sensing electrode with a reference capacity value for calibration, the reference capacity value stored in a reference capacity setting memory; a sensing result determinating unit configured to determine whether or not something is in proximity to or in contact with the proximity/contact sensing electrode, on the basis of a comparison result output from the comparator unit; a proximity/contact pattern identification unit configured to identify the sensing result as a predetermined pattern; and a determination unit configured to determine whether a water droplet is in contact with the contact sensing electrode or at least a part of a human body is in contact with the proximity/contact sensing electrode, on the basis of the sensing result and a threshold value, the sensing result being identified as the predetermined pattern, the threshold value stored in a threshold value setting memory.

According to still another aspect of the embodiments, there is provided a door handle device comprising: a contact sensing unit including a guide groove and a contact sensing electrode, the guide groove configured to guide a water droplet falling on a door, the contact sensing electrode disposed in the guide groove and configured to sense a contact with the door; a locking unit configured to execute unlocking and locking of the door; and a control unit configured to instruct to the locking unit to keep locking the door if it is determined that the water droplet is in contact with the door, on the basis of a sensing result sensed by the contact sensing electrode.

According to yet another aspect of the embodiments, there is provided a door handle device comprising: a proximity/contact sensing unit comprising a proximity/contact sensing electrode, the proximity/contact sensing electrode including a first electrode and a second electrode, the first electrode and the second electrode respectively formed so as to be values from which any one or both of an area and sensing sensitivity are different from each other, the proximity/contact sensing electrode configured to sense a proximity or contact to a door, the proximity/contact sensing unit configured to identify a sensing result sensed by the proximity/contact sensing electrode as a predetermined pattern; a locking unit configured to execute unlocking and locking of the door; and a control unit configured to instruct to the locking unit to keep locking the door if it is determined that the water droplet is in contact with the door, on the basis of a sensing result identified as the predetermined pattern.

According to further aspect of the embodiments, there is provided a control method of a door handle device, the door handle device comprising: a contact sensing unit including a guide groove and a contact sensing electrode, the guide groove configured to guide a water droplet falling on a door, the contact sensing electrode disposed in the guide groove and configured to sense a contact with the door; a locking unit configured to execute unlocking and locking of the door; and a control unit configured to instruct to the locking unit to keep locking the door if it is determined that the water droplet is in contact with the door, on the basis of a sensing result sensed by the contact sensing electrode, the control method of the door handle device comprising: sensing, by the contact sensing electrode, a contact with the door; determining, by the control unit, whether or not the water droplet is in contact with the door, on the basis of a sensing result sensed by the contact sensing electrode; and instructing, by the control unit, to the locking unit to unlock the door if it is determined that the water droplet is in contact with the door.

According to still further aspect of the embodiments, there is provided a control method of a door handle device, the door handle device comprising: a proximity/contact sensing unit comprising a proximity/contact sensing electrode, the proximity/contact sensing electrode including a first electrode and a second electrode, the first electrode and the second electrode respectively formed so as to be values from which any one or both of an area and sensing sensitivity are different from each other, the proximity/contact sensing electrode configured to sense a proximity or contact to a door; a locking unit configured to execute unlocking and locking of the door; and a control unit configured to instruct to the locking unit to keep locking the door if it is determined that the water droplet is in contact with the door, on the basis of a sensing result identified as the predetermined pattern, the control method of the door handle device comprising: sensing, by the proximity/contact sensing electrode, a proximity to or contact with the door; identifying, by the proximity/contact sensing unit, a sensing result sensed by the proximity/contact sensing electrode as a predetermined pattern; determining, by the control unit, whether or not the water droplet is in contact with the door, on the basis of a sensing result identified as the predetermined pattern; and instructing, by the control unit, to the locking unit to unlock the door if it is determined that the water droplet is in contact with the door.

According to yet further aspect of the embodiments, there is provided an electronic key system comprising: a contact sensing unit including a guide groove and a contact sensing electrode, the guide groove configured to guide a water droplet falling on a door, the contact sensing electrode disposed in the guide groove and configured to sense a contact with the door; a locking unit configured to execute unlocking and locking of the door; a non-contact sensing unit including a signal transmission reception unit and a key recognition unit, the signal transmission reception unit configured to transmit and receive a signal between electronic keys carried by a human, the key recognition unit configured to recognize the electronic key and operation of the electronic key on the basis of the signal transmitted and received by the signal transmission reception unit; and a control unit configured to recognize the electronic key and the operation of the electronic key, the control unit configured to instruct to the locking unit to keep locking the door if it is determined that the water droplet is in contact with the door, on the basis of a sensing result sensed by the contact sensing electrode.

According to yet further aspect of the embodiments, there is provided an electronic key system comprising: a proximity/contact sensing unit comprising a proximity/contact sensing electrode, the proximity/contact sensing electrode including a first electrode and a second electrode, the first electrode and the second electrode respectively formed so as to be values from which any one or both of an area and sensing sensitivity are different from each other, the proximity/contact sensing electrode configured to sense a proximity or contact to a door, the proximity/contact sensing unit configured to identify a sensing result sensed by the proximity/contact sensing electrode as a predetermined pattern; a locking unit configured to execute unlocking and locking of the door; non-contact sensing unit including a signal transmission reception unit and a key recognition unit, the signal transmission reception unit configured to transmit and receive a signal between electronic keys carried by a human, the key recognition unit configured to recognize the electronic key and operation of the electronic key on the basis of the signal transmitted and received by the signal transmission reception unit; and a control unit configured to recognize the electronic key and the operation of the electronic key, the control unit configured to instruct to the locking unit to keep locking the door if it is determined that the water droplet is in contact with the door, on the basis of a sensing result identified as the predetermined pattern.

According to the embodiments, there can be provided: the contact sensing device; the door handle device and the control method for such a door handle device; and the electronic key system, each for preventing a misoperation due to a water droplet adhering to a door handle, e.g. a vehicle, which has an electrostatic locking mechanism, etc.

According to the embodiments, there can be provided: the contact sensing device; the door handle device and the control method for such a door handle device; and the electronic key system, each for preventing a misoperation due to a water droplet adhering to a door handle, e.g. a vehicle, which has an electrostatic locking mechanism, etc., and also capable of reducing a fabricating cost.

BRIEF DESCRIPTION OF DRAWINGS

FIG. 1 is a schematic block configuration diagram showing a configuration example of a door handle device according to a first embodiment.

FIG. 16A is a schematic diagram for exemplifying a mounting substrate on which a proximity/contact sensing electrode used for the door handle device according to the second embodiment is installed, which is an example of a first electrode.

FIG. 16B is a schematic diagram for exemplifying the mounting substrate on which the proximity/contact sensing electrode used for the door handle device according to the second embodiment is installed, which is an example of a second electrode.

FIG. 16C is a schematic diagram for exemplifying the mounting substrate on which the proximity/contact sensing electrode used for the door handle device according to the second embodiment is installed, which is an example of installing the first electrode and the second electrode on the mounting substrate.

FIG. 17 is an explanatory diagram for exemplifying a disposing place, an area, and a sensitivity of the proximity/contact sensing electrode (the first electrode and the second electrode) in the second embodiment.

FIG. 27 is an explanatory diagram showing an example of a case classification of the sensing result sensed by the proximity/contact sensing electrode in the second embodiment.

DESCRIPTION OF EMBODIMENTS

Figure 2A:
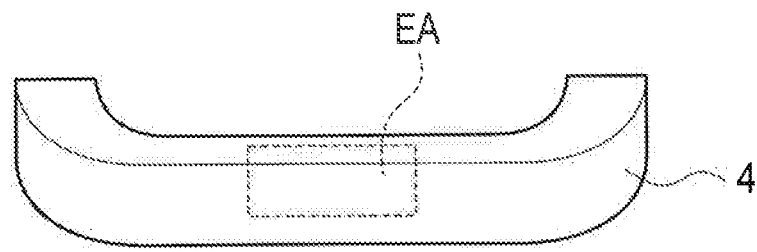
FIG. 2A is a schematic outline external view of an example of a door handle in a comparative example.

Next, certain embodiments will now be described with reference to drawings. In the description of the following drawings, the identical or similar reference numeral is attached to the identical or similar part. However, it should be noted that the drawings are schematic and a ratio of each size differs from an actual thing. Therefore, detailed size should be determined in consideration of the following explanation.

Of course, the part from which the relation and ratio of a mutual size differ also in mutually drawings is included. Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

First Embodiment

Block Configuration of Door Handle Device

FIG. 1 is an outline block configuration diagram showing a configuration example of a door handle device 1 according to the first embodiment.

The door handle device 1 according to the first embodiment is generally includes: a contact sensing unit 120 including a guide groove 19 (refer to FIG. 4) configured to guide a water droplet 9 falling on a door handle 4, and a contact sensing electrode 132 (refer to FIG. 4) disposed on the guide groove 19 and configured to sense a contact with a door handle 4; a locking unit 160 configured to execute unlocking and locking of the door handle 4; and a control unit 200 configured to instruct to the locking unit 160 to keep locking the door handle 4 if it is determined that the water droplet 9 is in contact with the door handle 4, on the basis of a sensing result sensed by the contact sensing electrode 132.

Moreover, the control unit 200 instructs to the locking unit 160 to unlock the door handle 4 if it is determined that at least a part of a human body (e.g., a hand 8 (refer to FIG. 8))

is in contact with the door handle 4 on the basis of the sensing result sensed by the contact sensing electrode 132.

As shown in FIG. 1, the door handle device 1 according to the first embodiment includes an opening and closing mechanism unit 100, an other sensing unit 300, an other functional unit 400, and a control unit (microcomputer) 200 configured to control the above-mentioned each unit. The opening and closing mechanism unit 100 includes a contact sensing unit 120, a non-contact sensing unit 140, and a locking unit 160. The other sensing unit 300 includes: an SOS signal sensing unit 302, a forced signal sensing unit 304, a test signal sensing unit 306, an engine starting sensing unit 308, a running speed sensing unit 310, and the other sensing unit 312. The engine starting sensing unit 308 and the running speed sensing unit 310 are optional features used when applying the door handle device 1 according to the first embodiment to a traveling means, such as a vehicle, etc.

The contact sensing unit 120 includes: a contact sensing electrode 132 including a sensing electrode for switch operations, e.g. an electrostatic capacitance sensor configured to sense an electrostatic capacity, for example; and an electrostatic switch control IC 126 configured to control the contact sensing electrode 132 (2-6 channels). An electrostatic switch control IC 126 includes a contact sensing LSI 20. The contact sensing electrode 132 senses whether a human (e.g., hand 8) is in contact with the door handle 4 or a raindrop 9 (water or a water droplet: hereafter using in the same meaning as a raindrop) is in contact with the door handle 4. More specifically, the contact sensing electrode 132 senses whether the water droplet 9, such as a rainfall etc., is in contact with the door handle 4, or at least a part of the human body (e.g., a hand, a finger, etc.) is in contact with the door handle 4 when a human performs an opening and closing operation of the door.

The control unit 200 instructs to the locking unit 160 to unlock the door if it is determined that at least a part of a human body is in contact with the contact portion, on the basis of the sensing result sensed by the contact sensing electrode 132.

The non-contact sensing unit 140 includes: a signal transmission reception unit (signal transmission reception device) 142 configured to transmit/receive a signal to/from an electronic key 3 including a card key, a smart phone, etc., for example; and a key recognition unit 144 configured to recognize a key and a key operation on the basis of the signal transmitted/received by the signal transmission reception unit 142.

The locking unit 160 includes: a locking unit (locking device) 162 configured to lock/unlock a door, etc.; and a locking control unit 164 configured to control the locking/unlocking with respect to the locking unit 162 on the basis of a sensing signal (data) sensed by the contact sensing unit 120, the non-contact sensing unit 140, the other sensing unit 300, etc.

The other functional unit 400 includes various functions, e.g. an air-conditioner function, a car navigation function, an audio/video function, and an illuminating function, for example, and can control the various functions on the basis of the sensing signal (data) sensed by the contact sensing unit 120, the non-contact sensing unit 140, the other sensing unit 300, etc.

(Comparative Example of Door Handle)

Figure 2B:
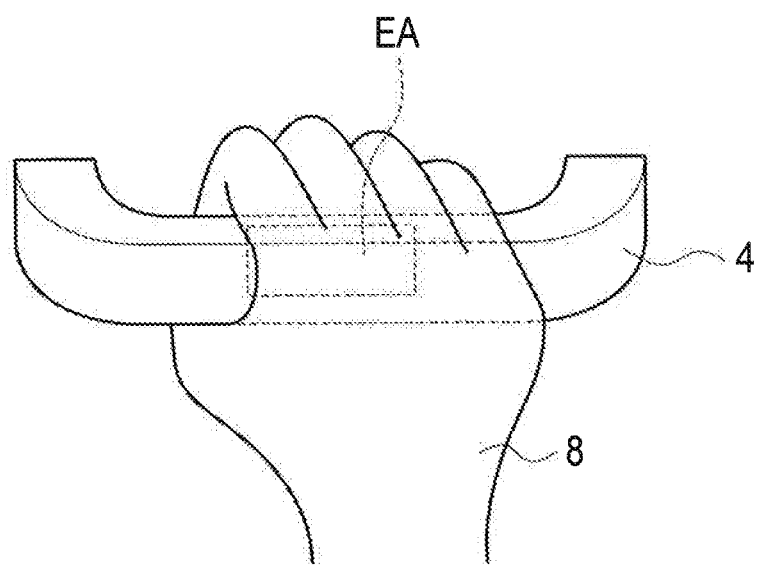
FIG. 2B is a schematic diagram for exemplifying an aspect that a human's hand grasps the door handle shown in FIG. 2A.
Figure 2C:
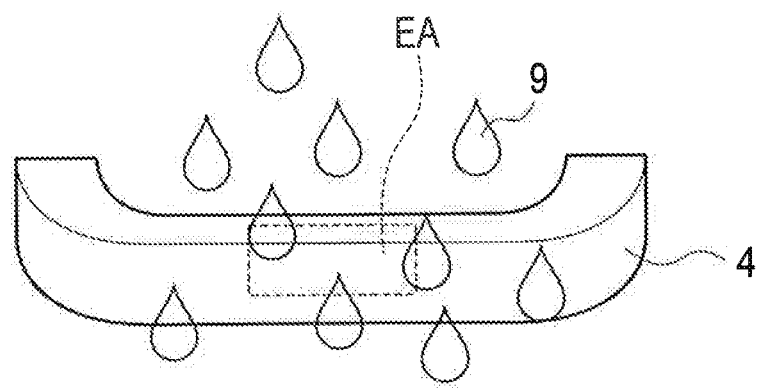
FIG. 2C is a schematic diagram for exemplifying an aspect that water droplets adhere to the door handle shown in FIG. 2A.

FIG. 2A shows a schematic outline external view of a door handle 4 in a comparative example, FIG. 2A schematically exemplifies an aspect that a human's hand 8 grasps the door handle 4 shown in FIG. 2B, and FIG. 2C exemplifies an aspect that a water droplet 9 is adhered to the door handle 4 shown in FIG. 2A.

A contact sensing electrode (not shown) including a sensing electrode for switch operation, e.g. an electrostatic capacitance sensor configured to sense an electrostatic capacity, is disposed on a sensing electrode arrangement area EA of the door handle 4 (is embedded in the door handle 4) shown in FIG. 2A. However, since the water droplet 9 has the same degree of the relative permittivity (epsilons=80) as the relative permittivity of the human body, it is undistinguishable whether a hand 8 is in contact with the contact sensing electrode (not shown) by grasping the door handle 4 with the human's hand 8 as show in FIG. 2B, or a water droplet 9 due to rainfall etc., is adhered to the contact sensing electrode (not shown) as shown in FIG. 2C. Accordingly, even if the water droplet 9 due to rainfall etc. is merely adhered to the door handle 4, an operation of releasing the door lock will be performed.

(Contact Sensing Electrode)

Figure 3A:
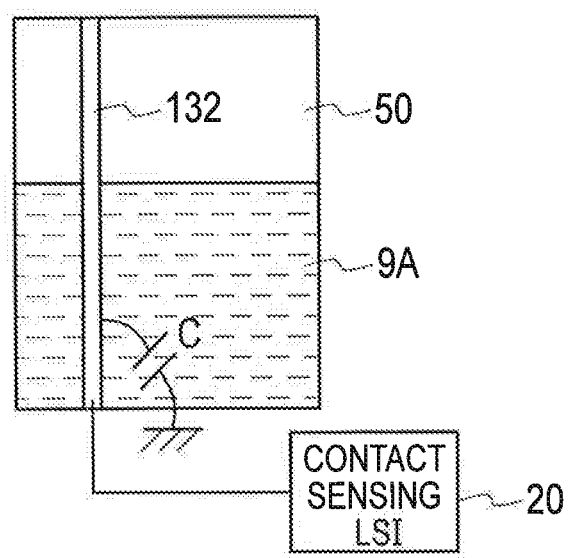
FIG. 3A is a schematic diagram for schematically exemplifying a sensing mechanism of a contact sensing electrode used in a contact sensing unit of the door handle device according to the first embodiment shown in FIG. 1, which is an example of a mechanism for sensing a volume of water (water level).
Figure 3B:
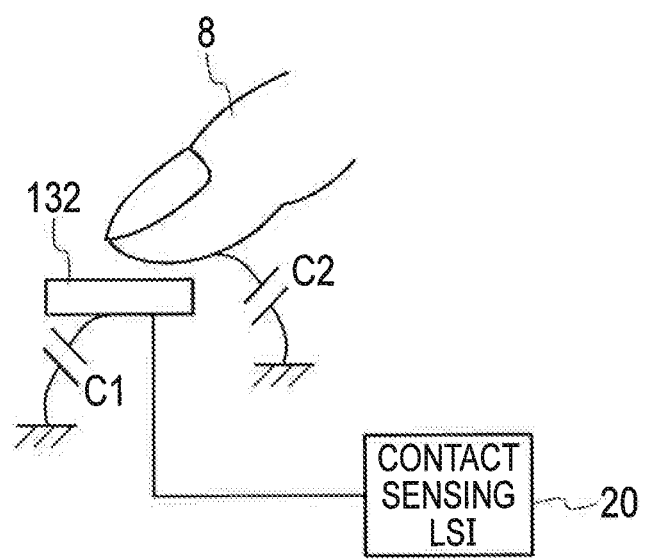
FIG. 3B is a schematic diagram for schematically exemplifying a sensing mechanism of a contact sensing electrode used in a contact sensing unit of the door handle device according to the first embodiment shown in FIG. 1, which is an example of a mechanism for sensing a human body (hand).

FIG. 3 exemplifies a sensing mechanism of the contact sensing electrode 132 used in the contact sensing unit 120 of the door handle device 1 according to the first embodiment shown in FIG. 1, FIG. 3A shows an example of a mechanism for sensing a volume of water (water level) 9A existed in a certain container 50, and FIG. 3B shows an example of a mechanism for sensing a human's hand 8.

As shown in FIG. 3A, the contact sensing electrode 132 used in the first embodiment is installed the outside or inside of the certain container 50, or is built in the container 50. The contact sensing electrode 132 is installed or built therein at a predetermined distance from the water 9 (i.e., at least a minimum required distance to sense the existence of the water 9 by the contact sensing electrode 132 (e.g., approximately 1 to 2 mm)). As the contact sensing electrode 132, an electrostatic capacity type sensing electrode can be used, for example, and the electrode is an electrode for sensing the presence or absence of contact of the water 9 with respect to the contact sensing electrode 132 (i.e., the existence of water 9) as change of the electrostatic capacity. The container 50 is grounded. Moreover, a reference capacity C used as the reference for calibrations is provided therein, and the contact sensing LSI 20 connected to the contact sensing electrode 132 is configured to compare an electrostatic capacity sensed by the contact sensing electrode 132, and the reference capacity C, in order to sense a volume of water 9 (water level) in the container 50.

If the container 50 shown in FIG. 3A is replaced by the door handle 4 used in the first embodiment, and the water 9 in the container 50 show in FIG. 3A is replaced by the water droplet 9 adhered to the door handle 4 used in the first embodiment, then the contact sensing LSI 20 determines whether or not the water droplet 9 is adhered to the contact sensing electrode 132 (i.e., door handle 4). More specifically, since the electrostatic capacity sensed by the contact sensing electrode 132 changes in accordance with the variation of the quantity (area) of water droplets 9 adhered with respect to the size (area) of the electrode, the contact sensing LSI 20 determines whether or not the water droplet 9 is adhered to the contact sensing electrode 132 (i.e., door handle 4) by monitoring the change of the electrostatic capacity value sensed by the contact sensing electrode 132.

Moreover, the contact sensing LSI 20 senses whether or not a human's hand 8 is in contact with the contact sensing electrode 132 by sensing change of the stray capacitance C1 exemplified in FIG. 3B. The contact sensing LSI 20 determines whether or not the human's hand 8 is in contact with the contact sensing electrode 132 (i.e., door handle 4) by installing such a contact sensing electrode 132 in the outside or inside of the door handle 4 used in the first embodiment, or building in an outer wall of the door handle 4.

Although electrostatic capacity type contact sensing electrodes are used as the contact sensing electrode 132, a pressure-sensitive resistance film type sensing electrodes can also be adopted thereinto instead of the capacitive sensing method.

(Structure Example 1 of Guide Groove)

Figure 4A:
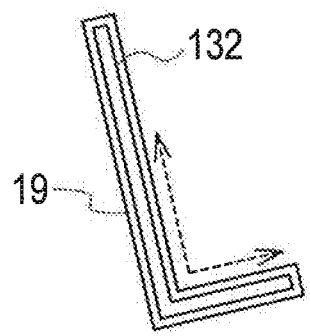
FIG. 4A is a schematic diagram for schematically exemplifying a shape of a guide groove used in the contact sensing unit of the door handle device according to the first embodiment, and the contact sensing electrode disposed in the guide groove, which is an example of a shape of the guide groove and the contact sensing electrode in the comparative example.
Figure 4B:
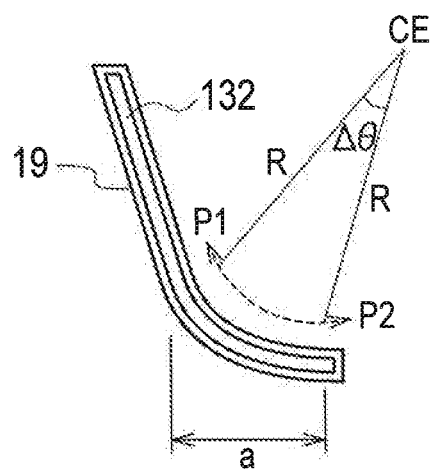
FIG. 4B is a schematic diagram for schematically exemplifying a shape of a guide groove used in the contact sensing unit of the door handle device according to the first embodiment, and the contact sensing electrode disposed in the guide groove, which is an example of a shape of the guide groove and the contact sensing electrode according to the first embodiment.
Figure 4C:
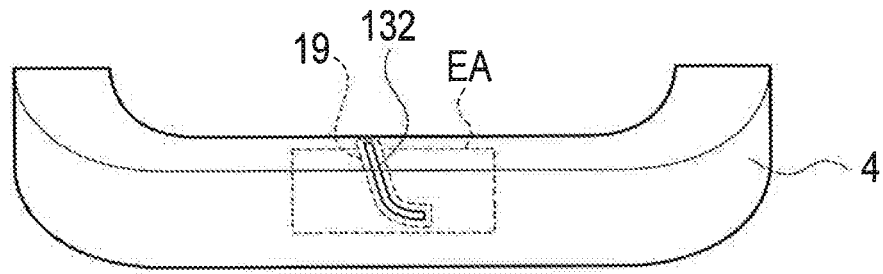
FIG. 4C shows an example of forming the guide groove and contact sensing electrode shown in FIG. 4B on a back side surface of the door handle.

FIG. 4 schematically exemplifies shapes of the guide groove 19 and the contact sensing electrode 132 disposed in the guide groove 19 used in the contact sensing unit 120 of the door handle device 1 according to the first embodiment. FIG. 4A shows an example of shapes of the guide groove 19 and the contact sensing electrode 132 in a comparative example, FIG. 4B shows an example of shapes of the guide groove 19 and the contact sensing electrode 132 according to the first embodiment, and FIG. 4C shows an example of forming the guide groove 19 and the contact sensing electrode 132 shown in FIG. 4B at a back surface side of the door handle 4.

As shown in FIG. 4C, the guide groove 19 for guiding the water droplet 9 to the contact sensing electrode 132 is provided in any one or both of the front surface and the back surface side of the door handle 4, and thereby the contact sensing electrode 132 guides the water droplet 9 so that adhesion of the water droplet 9 can be sensed with high accuracy. The contact sensing electrode 132 is installed in the outside or inside of the guide groove 19, or is built in a wall of the guide groove 19.

A guide groove 19 includes a staying portion (zone a shown in FIG. 4B) configured to soften a slope at a lower portion of the guide groove 19 (a lower portion toward to the drawing sheet of FIG. 4B) so that the water droplet 9 can be easily accumulated (can be easily stayed) on the contact sensing electrode 132, as shown in FIG. 4B. However, as shown in FIG. 4A, if the staying portion a of the guide groove 19 is formed so as to be square, it may become a "residual" of the water droplet 9 rather than the stay of the water droplet 9. Accordingly, the staying portion (zone a) of the guide groove 19 may be formed so as to be rounded as shown in FIG. 4B, instead of being formed as square as shown in FIG. 4A. More specifically, as shown in FIG. 4B, if the center of circle forming the roundness (trajectory from P1 to P2) in which the water droplet 9 on the staying portion (zone a) of the guide groove 19 is accumulated is CE, and the central angle of the trajectory from P1 to P2 in which the water droplet 9 is satisfactorily accumulated is AO, then the curvature radius is R.

Note that the staying portion a of the guide groove 19 may be formed so as to be square if the water droplet 9 is satisfactorily accumulated (stayed) on the contact sensing electrode 132, even if the staying portion a of the guide groove 19 is formed so as to be square as shown in FIG. 4A.

Moreover, a guide groove (not shown) configured to collect the water droplet 9 to be guided to the guide groove 19 may be formed at a top edge of the guide groove 19. The water droplet 9 can be efficiently guided to the guide groove 19 by forming such a guide groove at the top edge of the guide groove 19.

Figure 5A:
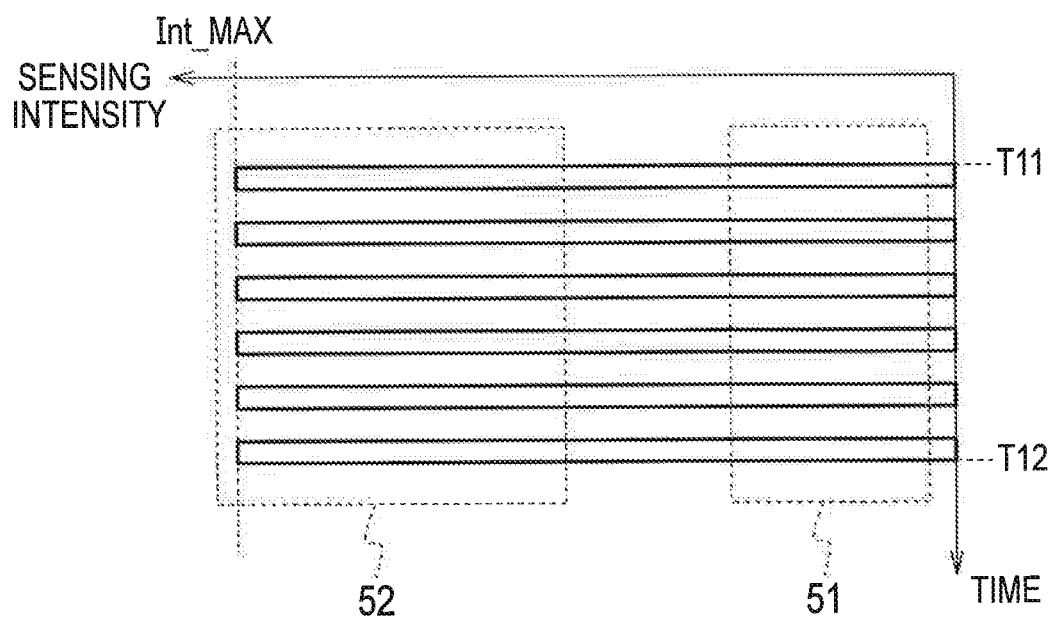
FIG. 5A is a schematic diagram for schematically exemplifying an example of a sensed capacitance sensed by the contact sensing electrode used in the contact sensing unit of the door handle device according to the first embodiment, which is an example of the case where a hand is in contact with the whole of the contact sensing electrode by grasping the door handle with a human's hand.
Figure 5B:
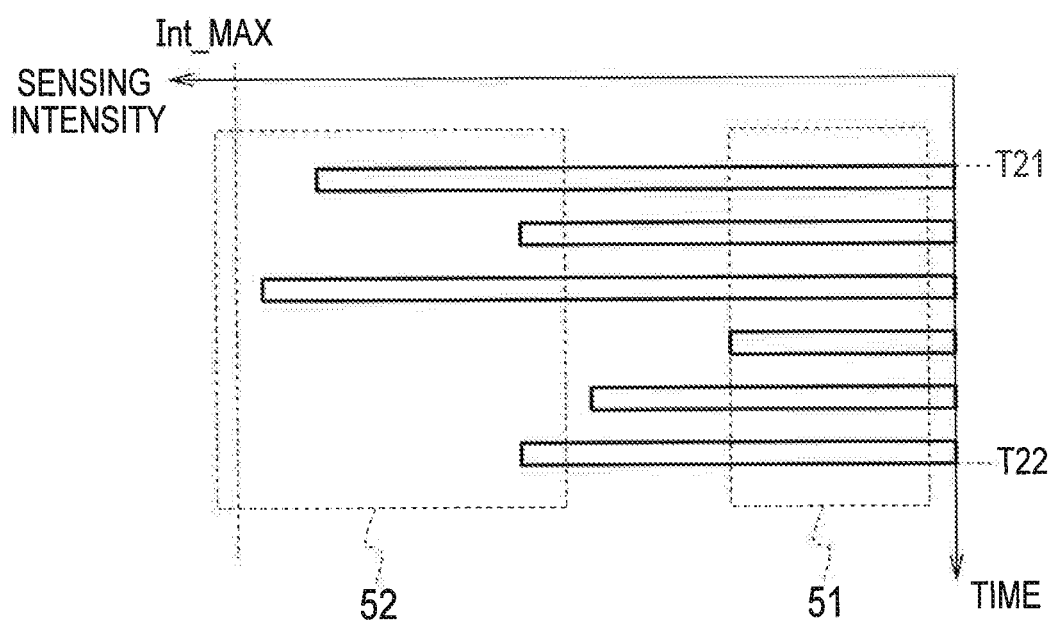
FIG. 5B is a schematic diagram for schematically exemplifying an example of a sensed capacitance sensed by the contact sensing electrode used in the contact sensing unit of the door handle device according to the first embodiment, which is an example of the sensed capacitance when raindrops are partially adhered to the contact sensing electrode at the time of rainfall.

A sensing result (sensed capacitance) sensed by the contact sensing electrode 132 can be obtained as shown in FIG. 5 by forming the guide groove 19 and the contact sensing electrode 132 in the door handle 4 as shown in FIG. 4C. FIG. 5A shows an example of a sensing result (sensed capacitance) when a hand 8 is in contact with the whole of the contact sensing electrode 132 by grasping the door handle 4 with a human's hand 8, and FIG. 5B shows an example of a sensing result (sensed capacitance) when a water droplet 9 is partially adhered to the contact sensing electrode 132 at the time of rainfall.

In the example of FIG. 5A, since the hand 8 is contacted so that the whole of the contact sensing electrode 132 is covered over the time T11 to time T12, the sensed capacitance (sensing intensity) during the time T11 to T12 is always stabilized at a sensing maximum Int_MAX degree.

In the example of FIG. 5B, since the water droplet 9 is partially adhered to the contact sensing electrode 132, the sensed capacitance during the time T11 to T12 becomes unstable. Although a sensing result relatively stable over time T11 to time T12 due to an effect produced by forming the guide groove 19 is obtained in particular in the sensing result zone 51, the obtained sensing result becomes always unstable since a region to which the water droplet 9 is adhered to the contact sensing electrode 132 is produced in a sensing result zone 52, unless the whole of the contact sensing electrode 132 goes under the water.

Thus, the contact sensing LSI 20 can discriminate whether the human's hand 8 is in contact with the contact sensing electrode 132 (i.e., door handle 4) or the water droplet 9 is in contact therewith, on the basis of the sensed capacitance value sensed in the sensing result zone 52.

(Structure Example 2 of Guide Groove)

FIG. 6 schematically exemplifies an example of a guide groove 19 and a sensing electrode arrangement area EA in which the contact sensing electrode 132 is disposed, used in the contact sensing unit of the door handle device 1 according to the first embodiment. FIG. 6A is a schematic diagram for schematically exemplifying a size of the door handle 4 used in the first embodiment. FIG. 6B shows an example in the case of grasping a left side portion of the door handle 4 shown in FIG. 6A with a child's hand 8. FIG. 6C shows an example in the case of grasping a right side portion of the door handle 4 shown in FIG. 6A with the child's hand 8. FIG. 6D shows an example in the case of grasping the door handle 4 shown in FIG. 6A with an adult's hand 8.

Figure 6A:
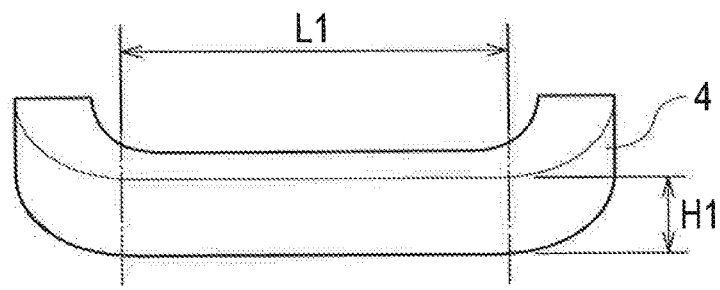
FIG. 6A is a schematic diagram for schematically exemplifying an example of a sensing electrode arrangement area of the guide groove and the contact sensing electrode used in the contact sensing unit of the door handle device according to the first embodiment, which is a schematic diagram for schematically exemplifying the size of the door handle used in the first embodiment.
Figure 6B:
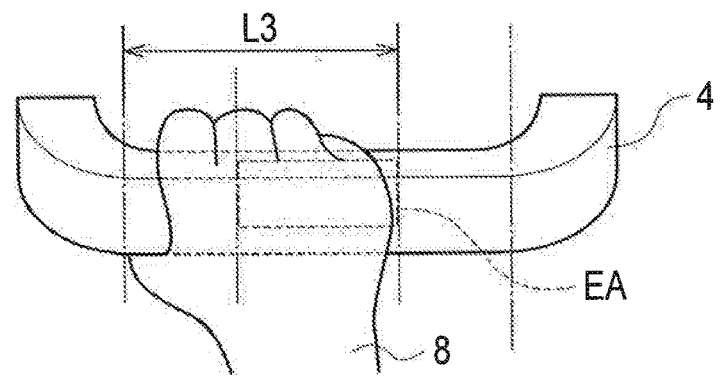
FIG. 6B shows an example in the case of grasping a left side portion of the door handle shown in FIG. 6A with a child's hand.
Figure 6C:
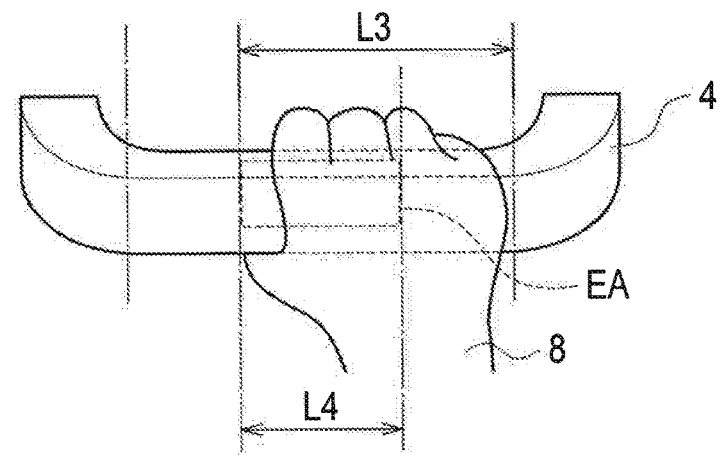
FIG. 6C shows an example in the case of grasping a right side portion of the door handle shown in FIG. 6A with the child's hand.
Figure 6D:
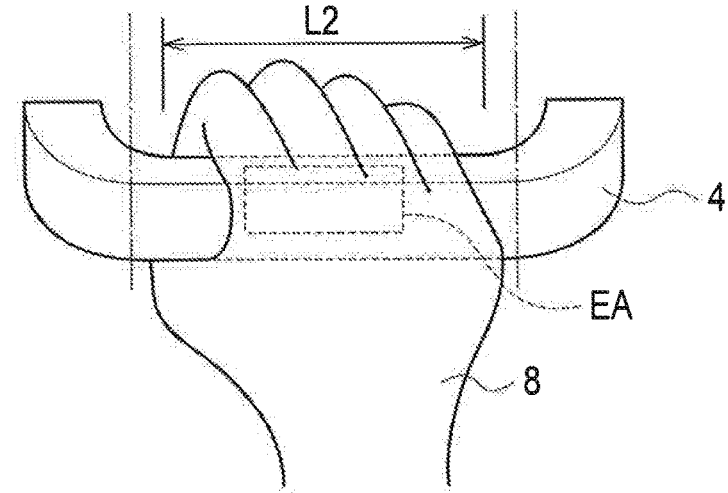
FIG. 6D shows an example in the case of grasping the door handle shown in FIG. 6A with an adult's hand.

In the example of FIG. 6D, since the adult's large hand 8 grasps (touches) almost all the handle portion of the door handle 4, it hardly to receive an effect due to a shape or disposing place of the contact sensing electrode 132 even if a position to be grasped misaligns to either right or left somewhat, where a length in a long-side direction of a handle portion of the door handle 4 is L1 (e.g., 9 cm), a length in a height direction of the handle portion of the door handle 4 is H1, a length in the long-side direction of the handle portion of the door handle 4 covered with the adult's hand 8 by being grasped with the adult's hand 8 is L2, and a length in the long-side direction of the handle portion of the door handle 4 contacted (covered) with the child's hand 8 by being grasped with the child's hand 8 is L3, as shown in to FIG. 6. On the other hand, in the case of the child's small hand 8, if a position to be grasped biases toward either right or left, the case where the whole of the contact sensing electrode 132 cannot be grasped will occur as shown in FIGS. 6B and 6C. Accordingly, at least one guide groove 19 is formed in the sensing electrode arrangement area EA using an overlapped portion of length L4 shown in FIGS. 6B and 6C, and setting a size of the sensing electrode arrangement area EA according to the first embodiment to L4×H1, and then the contact sensing electrode 132 is respectively disposed on each guide groove 19 (refer to FIG. 7).

In the present embodiment, the Length L4 of the overlapped portion is calculated with the following equation (1):

$$L4 = 2 \times L3 - L1, \quad (1)$$

the length L4 of the overlapped portion is obtained as approximately 3 cm, for example, where L1 is approximately 9 cm, L2 is approximately 8 cm, and L3 is approximately 6 cm.

Thus, wherever a relatively small child's hand grasps the handle portion of the door handle 4, the contact can be satisfactorily sensed by forming the sensing electrode arrangement area EA so that the overlapped portion (portion which is certainly touched) is included wherever the handle portion of the door handle 4 is grasped.

Figure 7:
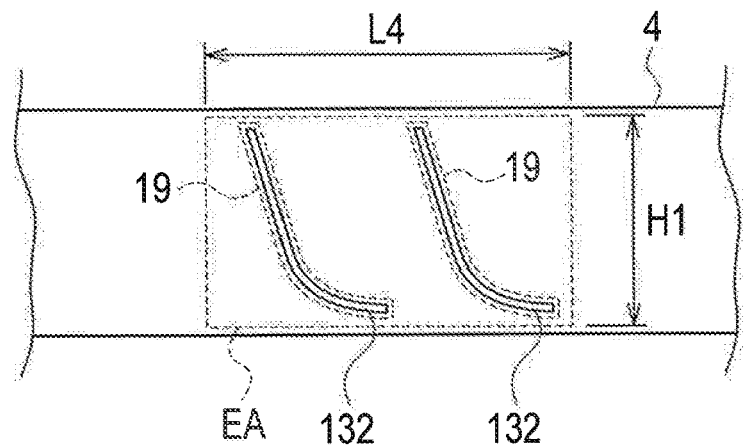
FIG. 7 is a schematic diagram for schematically exemplifying an example of the guide groove and the contact sensing electrode shown in FIG. 6, each formed in the sensing electrode arrangement area.
Figure 8A:
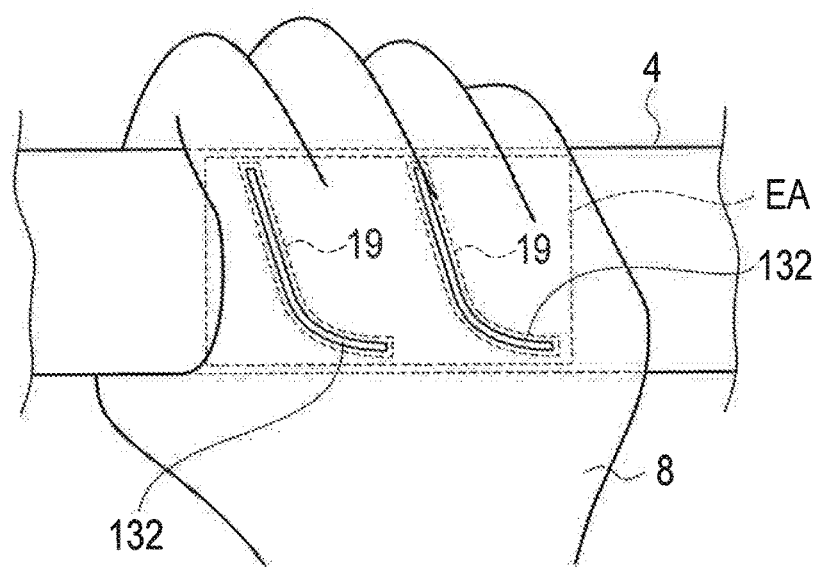
FIG. 8A is a schematic diagram for schematically exemplifying a door handle which has the sensing electrode arrangement area on which the guide groove and the contact sensing electrode shown in FIG. 7 are formed, which is an example of an aspect that a human's hand grasps the sensing electrode arrangement area of the door handle.
Figure 8B:
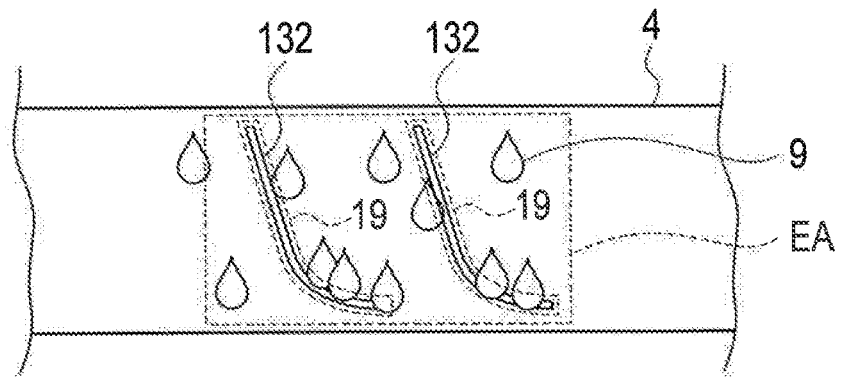
FIG. 8B is a schematic diagram for schematically exemplifying the door handle which has the sensing electrode arrangement area on which the guide groove and the contact sensing electrode shown in FIG. 7 are formed, which is an example of an aspect that raindrops are adhered to the sensing electrode arrangement area of the door handle partially.

FIG. 7 schematically exemplifies an example of two guide grooves 19 formed in the sensing electrode arrangement area EA shown in FIG. 6, and the contact sensing electrodes 132 respectively disposed in two guide grooves 19. Moreover, FIG. 8 is a schematic diagram for schematically exemplifying the door handle 4 having the sensing electrode arrangement area EA shown in FIG. 7. FIG. 8A shows an example of an aspect that a human's hand grasps the sensing electrode arrangement area EA of the door handle 4, and FIG. 8B shows an example of an aspect that a water droplet 9 is partially adhered to the sensing electrode arrangement area EA of the door handle 4.

Figure 9A:
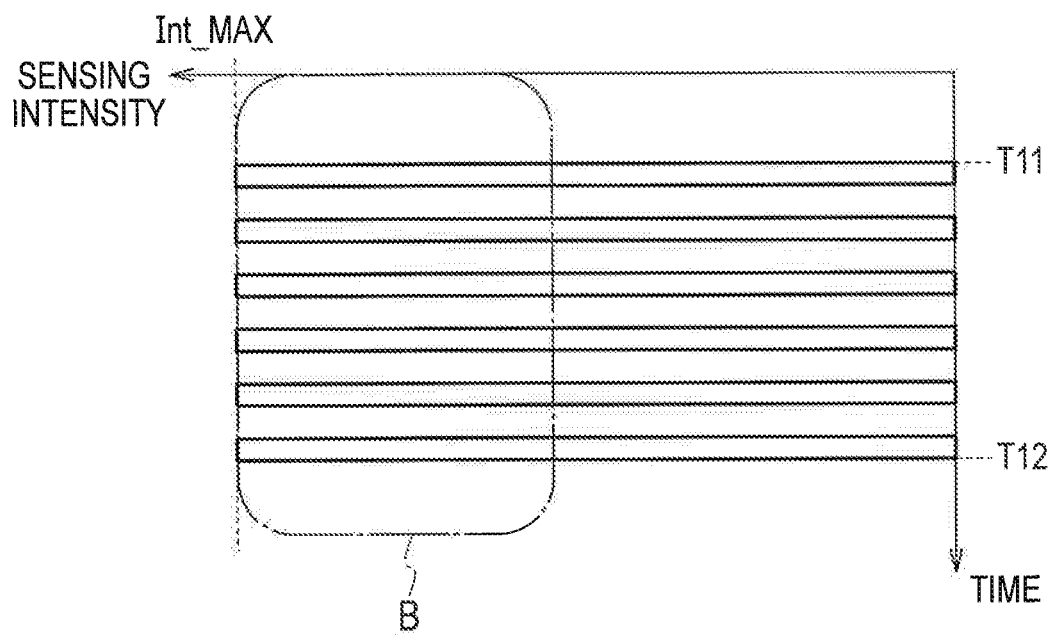
FIG. 9A is a schematic diagram for schematically exemplifying a discriminating portion of the sensed capacitance used when discriminating an object in contact with the contact sensing electrode according to the first embodiment, which is an example of the case where a hand is in contact with the whole contact sensing electrode by grasping the door handle with a human's hand.
Figure 9B:
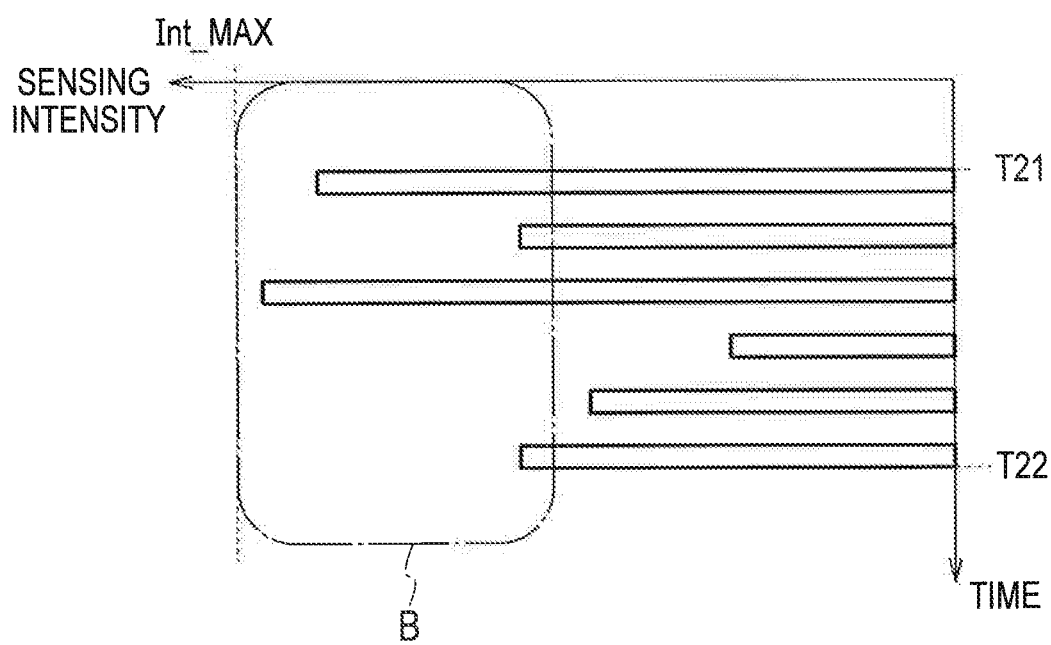
FIG. 9B is a schematic diagram for schematically exemplifying the discriminating portion of the sensed capacitance used when discriminating an object in contact with the contact sensing electrode according to the first embodiment, which is an example of a case where raindrops are partially adhered to the contact sensing electrode at the time of rainfall.

Moreover, FIG. 9 schematically exemplifies a discriminating portion B of the sensed capacitance used when discriminating an object in contact with the contact sensing electrode according to the first embodiment 132. FIG. 9A shows an example of a hand 8 being in contact with the whole of the contact sensing electrode 132 by grasping the door handle 4 with the human's hand 8. FIG. 9B shows an example of the water droplet 9 being partially adhered to the contact sensing electrode 132 at the time of rainfall.

In the example of FIG. 9A, since the hand 8 is contacted so that the whole of the contact sensing electrode 132 is covered over the time T11 to time T12, the sensed capacitance (sensing intensity) during the time T11 to T12 is always stabilized at a sensing maximum Int_MAX degree.

On the other hand, in the example of FIG. 9B, since the water droplet 9 is partially adhered to the contact sensing electrode 132, the sensed capacitance during the time T11 to T12 becomes unstable. In particular in the sensing result zone B, the obtained sensing result becomes always unstable since a region to which the water droplet 9 is adhered to the contact sensing electrode 132 is produced, unless the whole of the contact sensing electrode 132 goes under the water.

Thus, the contact sensing LSI 20 can discriminate whether the human's hand 8 is in contact with the contact sensing electrode 132 (i.e., door handle 4) or the water droplet 9 is in contact therewith, on the basis of the sensed capacitance value sensed in the sensing result zone B. That is, the contact sensing LSI 20 can discriminate that the hand 8 is in contact with the contact sensing electrode 132, if the sensed capacitance is stable, by confirming the sensed capacitance in the sensing result zone B, but can discriminate that the water droplet 9 of rainfall is in contact with the contact sensing electrode 132 conversely if the sensed capacitance is unstable.

(Block Configuration of Contact Sensing LSI (Contact Sensing Device))

Figure 10:
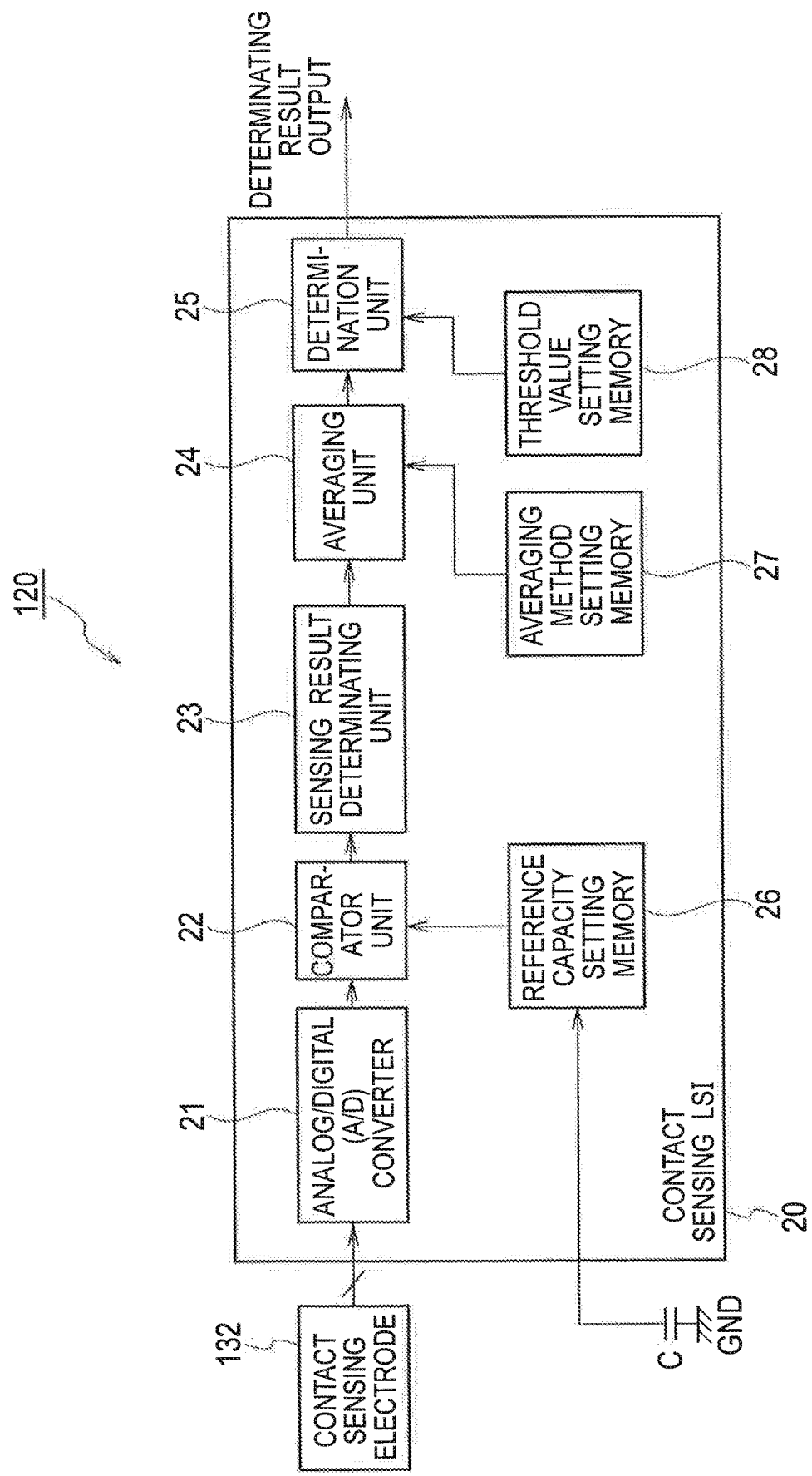
FIG. 10 is a schematic block diagram for exemplifying a configuration example of a contact sensing LSI of the contact sensing unit according to the first embodiment.

FIG. 10 is a schematic block diagram for exemplifying a configuration example of a contact sensing LSI 20 (contact sensing device) of the contact sensing unit 120 according to the first embodiment.

The contact sensing LSI 20 includes: an analog/digital (A/D) converter 21 configured to convert a sensing result (sensed capacitance) sensed by a contact sensing electrode 132 from analog data to digital data, the contact sensing electrode 132 disposed in a guide groove 19 for guiding a water droplet falling on a door, the contact sensing electrode 132 configured to sense the water droplet being in contact with a door handle 4; a comparator unit 22 configured to compare a sensed capacitance value output from the A/D converter 21 with a reference capacity (dummy capacitance) value for calibrations stored in a reference capacity setting memory 26; a sensing result determinating unit 23 configured to determine whether or not something is in contact with the contact sensing electrode 132 on the basis of a comparison result output from the comparator unit 22; an averaging unit 24 configured to execute averaging processing with respect to the sensing result on the basis of various kinds of set values of an averaging method (averaging filter) stored in an averaging method setting memory 27; and a determination unit 25 configured to determine whether the human's hand 8 is in contact with the contact sensing electrode 132 (i.e., door handle 4) or the water droplet 9 is in contact with the contact sensing electrode 132, on the basis of the sensing result subjected to averaging processing etc. by the averaging unit 24, and a predetermined threshold value stored in a threshold value setting memory 28. A determination threshold value in the sensing result zone B shown in FIG. 9 is set up and stored in the threshold value setting memory 28.

Since the reference capacity value is different for every system in accordance with wirings, circuits, etc. actually disposed in the door handle 4, the reference capacity value and a storing method to the reference capacity setting memory 26 are reviewed to be determined at the time of system construction (design). For example, the reference capacity setting memory 26 can be composed as a read-only memory (ROM) if the reference capacity value can be previously specified, but the reference capacity setting memory 26 can be composed as a random access memory (RAM) since a value of the reference capacity C is stored each time at the time of operation start if the reference capacity value cannot be previously specified.

(Application Circuit Configuration of Contact Sensing Unit)

Figure 11:
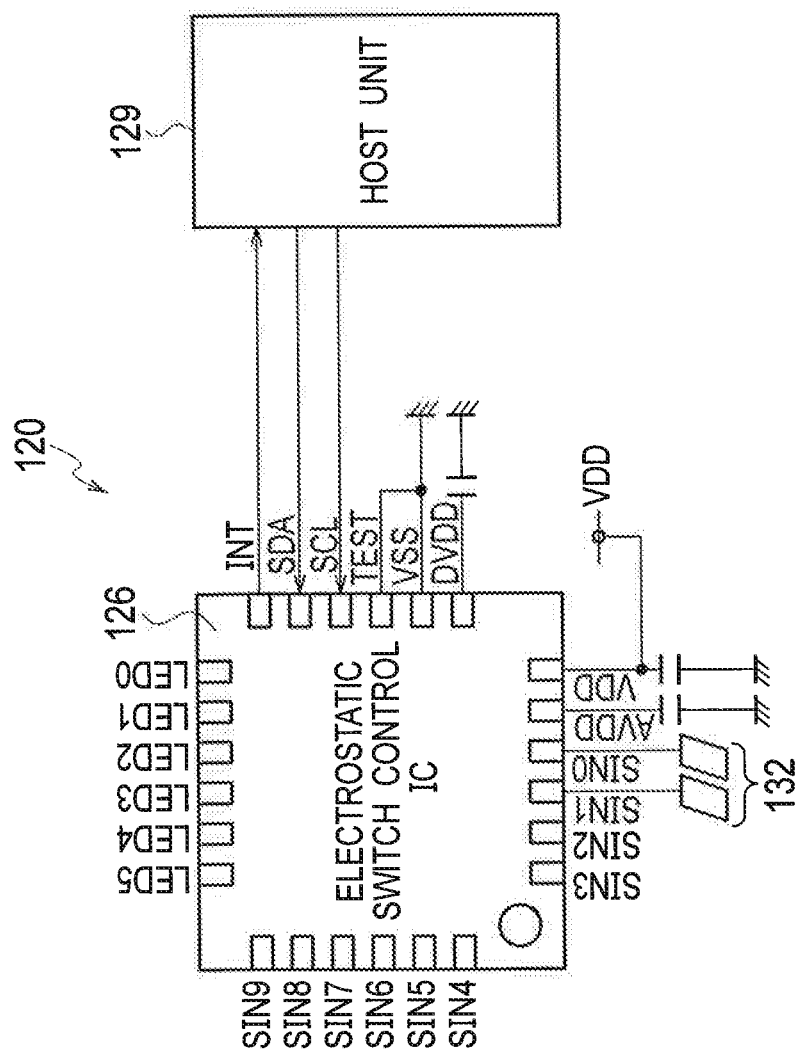
FIG. 11 is a schematic block diagram for exemplifying a configuration example of an application circuit configuration in the contact sensing unit according to the first embodiment.

FIG. 11 is a schematic block diagram for exemplifying a configuration example of an application circuit configuration in the contact sensing unit 120 according to the first embodiment.

As shown in FIG. 11, the application circuit configuration of the contact sensing unit 120 includes: an electrostatic switch control IC 126; and a contact sensing electrode 132 (two contact sensing electrodes 132 in the example shown in FIG. 11) connected to the electrostatic switch control IC 126, wherein the electrostatic switch control IC 126 is connected to a host unit 129, e.g. an electronic apparatus of the electronic key system.

The electrostatic switch control IC 126 is a controller for the electrostatic capacitance sensor for switch operation of the contact sensing electrode 132.

The electrostatic switch control IC 126 can include: Analog Front End (AFE) for sensing the electrostatic capacity; an A/D converter for converting the sensed capacity into a digital sensed value; a Micro Processing Unit (MPU) for processing a sensed value; a Light Emitting Diode (LED) controller supporting a Pulse Width Modulation (PWM) wave; a two-wire serial bus host interface supporting Inter-Integrated Circuit (I2C) bus protocol; power on reset; a clock oscillation circuit; an internal Low Drop-Out regulator (LDO), etc.

In the electrostatic switch control IC 126, one electrostatic capacitance sensor can be used as one independent switch (i.e., independent contact sensing electrode 132) as shown in FIG. 11. ON, OFF, long pressing operations, etc. can be recognized in each of the independent sensing sensors.

(Control Method of Door Handle Device)

Figure 12:
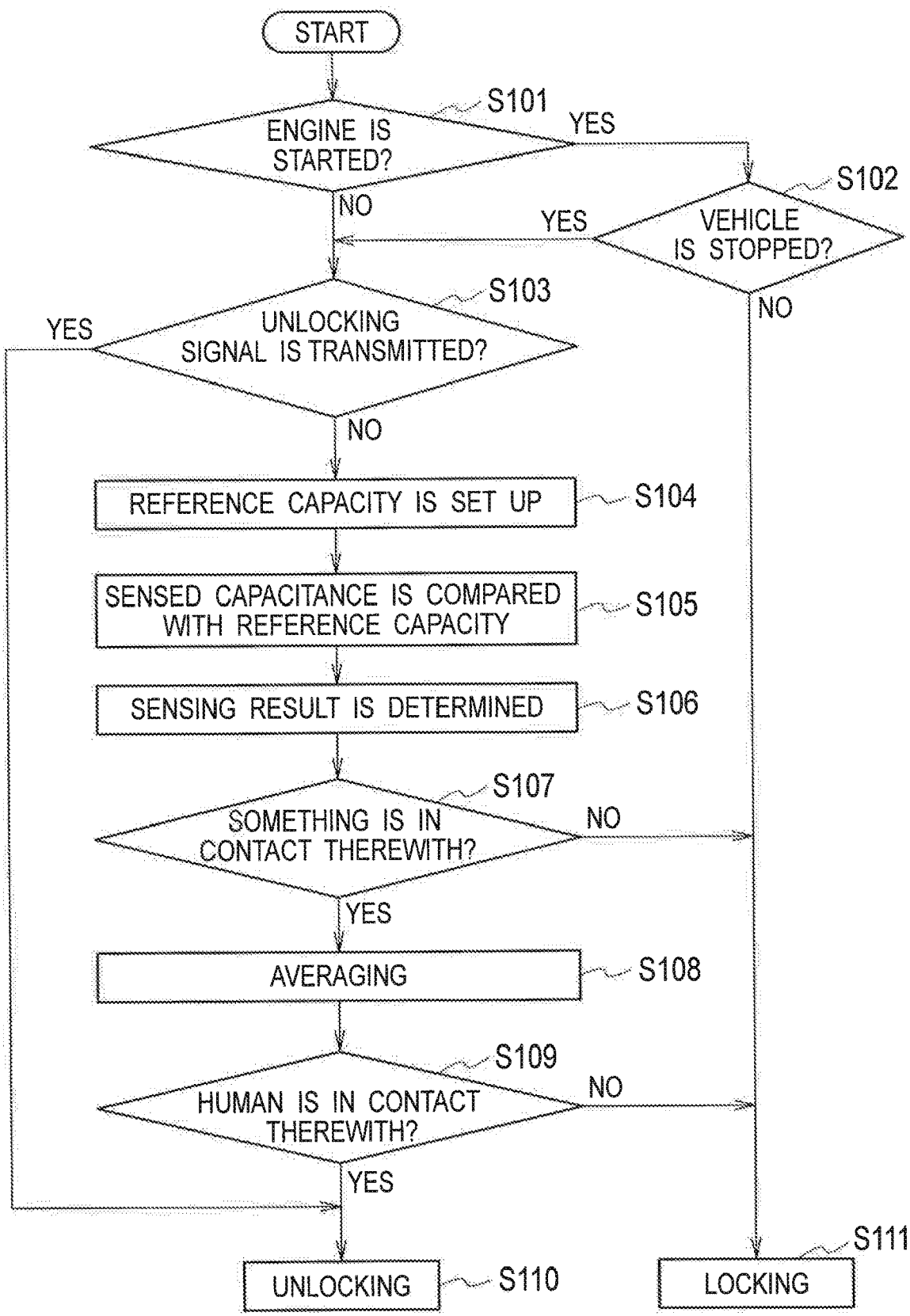
FIG. 12 is an outline flowchart for exemplifying a processing procedure for discriminating a contact with the door handle in order to lock/unlock the door, in the door handle device according to the first embodiment.

FIG. 12 exemplifies a processing procedure for discriminating a contact with the door handle in order to lock/unlock the door, in the door handle device according to the first embodiment.

When a human (driver etc.) who carries an electronic key 3 (attached to the body) enters within a range (operation range) capable of receiving a signal currently sent from the vehicle side, the electronic key 3 and the non-contact sensing unit 140 in the vehicle will transmit and receive the signals.

In Step S101, the control unit 200 determines whether an engine of the vehicle is started on the basis of a sensing signal output from the engine starting sensing unit 308. If the engine of the vehicle has been started, then, in Step S102, the control unit 200 determines whether or not the vehicle is stopped on the basis of the sensing signal output from the running speed sensing unit 310. If the vehicle 1 is driving, i.e., if the vehicle is not stopped, in Step S111, the control unit 200 transmits an instruction to the locking control unit 164 to keep the locking unit 162 in a locking state.

On the other hand, if determining that the engine of the vehicle 1 is not started in Step S101 (i.e., the engine is stopped), or if determining that the vehicle 1 is stopped although the engine of the vehicle 1 is started in Step S102, then the processing goes to Step S103.

In Step S103, the control unit 200 determines whether or not a signal to release the lock (unlocking signal) is transmitted from the electronic key 3 to the non-contact sensing unit 140, and the control unit 200 transmits an instruction to the locking control unit 164 to unlock the locking unit 162, in Step S110, if the unlocking signal is transmitted.

In Step S103, if the signal to release the lock (unlocking signal) is not transmitted from the electronic key 3, then the processing goes to the steps in and after Step S104 in the contact sensing LSI 20 of the contact sensing unit 120.

In Step S104, the contact sensing LSI 20 sets up the reference capacity (dummy capacitance) value for calibration. More specifically, a value previously stored in the reference capacity setting memory 26 is used as the sensing maximum Int_MAX (state of full) to be sensed by the contact sensing electrode 132, or the reference capacity (dummy capacitance) C is set to be stored in the reference capacity setting memory 26 as the sensing maximum Int_MAX (state of full) used for this processing.

Next, in Step S105, the comparator unit 22 compares the sensed capacitance value sensed by the contact sensing electrode 132 with the reference capacity (dummy capacitance) value for calibration stored in the reference capacity setting memory 26.

Next, in Step S106, the sensing result determinating unit 23 determines whether or not something is in contact with the contact sensing electrode 132 (in particular the staying portion (zone a) in FIG. 4B) on the basis of the comparison result output from the comparator unit 22.

In Step S107, if the sensing intensity in the staying portion (zone a) of the contact sensing electrode 132 is unstable (if it is not a state of full), the determination unit 25 determines that nothing is in contact with the contact sensing electrode 132, and then the processing goes to Step S111. Then, in Step S111, the control unit 200 transmits an instruction to the locking control unit 164 to keep the locking unit 162 in the locking state.

Conversely, in Step S107, if the value where a sensing intensity in the staying portion (zone a) of the contact sensing electrode 132 is stabilized (state of full) is sensed, the sensing result determinating unit 23 determines that something is in contact with the contact sensing electrode 132, and then the processing goes to Step S108.

Next, in Step S108, the averaging unit 24 executes averaging processing etc. with respect to the sensing result, on the basis of various kinds of the set value for averaging methods already stored in the averaging method setting memory 27.

Next, in Step S109, the determination unit 25 configured to determine whether the human's hand 8 is in contact with the contact sensing electrode 132 (i.e., door handle 4) or the water droplet 9 is in contact with the contact sensing electrode 132, on the basis of the sensing result subjected to averaging etc. by the averaging unit 24, and the threshold value stored in a threshold value setting memory 28. For example, if the sensed capacitance is stable with regard to the sensing result zone B as compared with the setting threshold value (refer to FIG. 9A), the determination unit 25 determines that the human's hand 8 is in contact with the contact sensing electrode 132, and then the processing goes to Step S110. Then, in Step S111, the control unit 200 transmits an instruction to the locking control unit 164 to unlock the locking unit 162.

Conversely, if the sensed capacitance is unstable with respect to the sensing result zone B as compared with the setting threshold value (refer to FIG. 9B), the determination unit 25 determines that the water droplet 9 is in contact with the contact sensing electrode 132, and then the processing goes to Step S110. Then, in Step S111, the control unit 200 transmits an instruction to the locking control unit 164 to keep the locking unit 162 in the locking state. Note that variation in the sensed capacitance (instability) in case of snow coverage is smaller than that of the time of rainfall.

[Averaging Method Determination Memory]

In Step S108, various kinds of the set value for the averaging method (averaging filter) stored in the averaging method setting memory 27 used by the averaging unit 24 executes removal of a noise, etc. by averaging sampling data, for example, including the following items:

Setting of a parameter to be averaged,
Setting of the number of valid data (simple, the number from the center, the number from the top, the number from the bottom, etc.), and
Sort order (nothing, ascending order, descending order, etc.).

Figure 13:
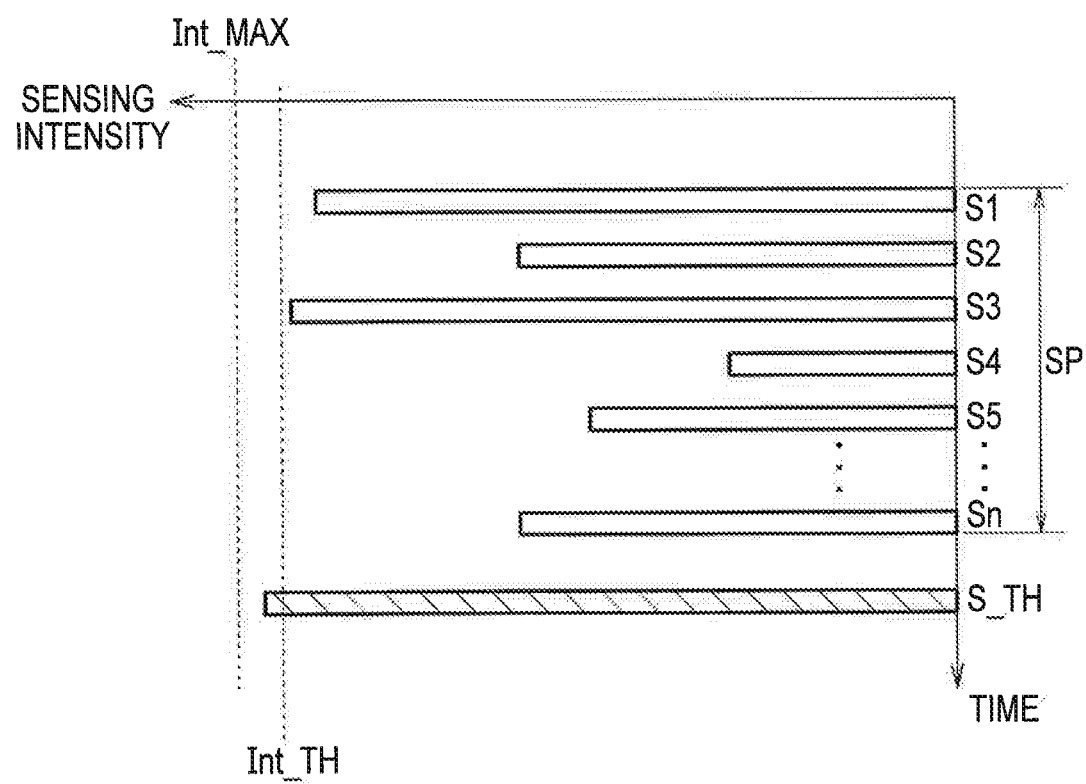
FIG. 13 is a schematic diagram for schematically exemplifying an example of an averaging method executed in an averaging unit in the contact sensing LSI according to the first embodiment.

FIG. 13 schematically exemplifies an example of the averaging method executed in the averaging unit 24 of the contact sensing LSI 20 according to the first embodiment. FIG. 13 shows an example of having n pieces of samples, e.g., a sample 51 to a sample Sn between the sampling period SP, and a sampling interval is several milliseconds, for example.

A median filter etc. can also be used instead of the averaging filter.

Thus, the determination unit 25 sets up the threshold value Int_TH on the basis of the sensing result subjected to the averaging etc. by the averaging unit 24, and then stores the threshold value Int_TH in the threshold value setting memory 28, as shown in FIG. 13. Then, the determination unit 25 discriminates whether the human's hand 8 is in contact with the contact sensing electrode 132 (i.e., door handle 4) or the water droplet 9 is in contact with the contact sensing electrode 132, on the basis of the threshold value Int_TH and the sensed capacitance in sensing result zone B.

According to the embodiments, there can be provided: the contact sensing device; the door handle device and the control method for such a door handle device; and the electronic key system, each for preventing a misoperation due to a water droplet adhering to a door handle, e.g. a vehicle, which has an electrostatic locking mechanism, etc.

Second Embodiment

Comparative Example

Figure 14:
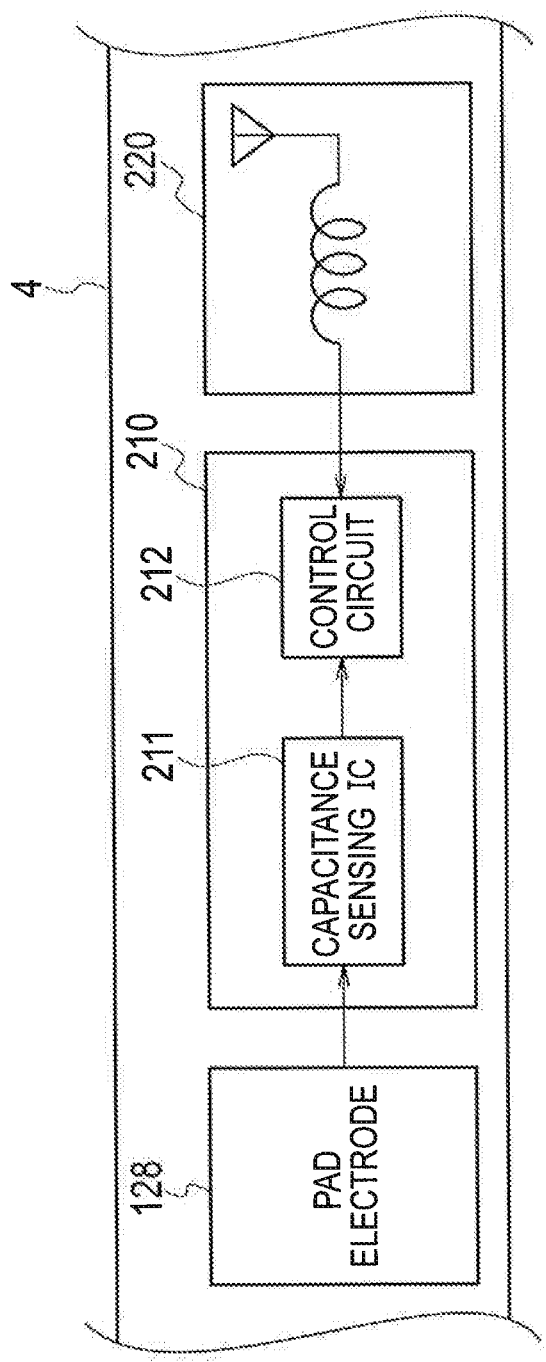
FIG. 14 is a schematic outline external view of an example of a door handle having an automatic unlocking function in a comparative example of the second embodiment.

FIG. 14 schematically shows an example of a door handle including an automatic unlocking function, in a comparative example.

As shown in FIG. 14, the door handle 4 contains: an electrostatic capacity type contact sensing electrode (pad electrode) 128; a mounting substrate (Printed Circuit Board (PCB)) 210 including a capacitance sensing IC 211 and a control circuit 212; and an antenna 220. The door handle 4 has an automatic unlocking function for releasing a door lock only when a hand 8 is in contact with the door handle 4 by an electrostatic touch switch. The contact sensing electrode 128 is an electrode for sensing a human being in contact therewith. As the contact sensing electrode 128, there are listed an electrode built in a back surface side of the door handle 4 in order to sense that a human grasps the door handle 4, and an electrode built in both of a front side surface and the back side surface of the door handle 4 in order to certainly sense the grip. The antenna 220 transmits and receive signals, e.g. an identifying signal, an authentication signal, and an unlocking/locking signal, to/from electronic keys, e.g. a card key, a smart phone, etc.

Generally, since the door handle 4 is disposed in the outdoors, e.g., outside of vehicles etc., it is easy to be exposed to wind and rain. If sensing whether or not a human's hand 8 is in contact with the door handle 4 by the capacitive sensing method, it is difficult to discriminate between a human body and water since the permittivity of the human body and the permittivity of the water are close to each other. If water droplets at the time of rainfall, car washing, etc. are adhered to the door handle 4, a system side may false-recognize that the hand 8 is in contact with the door handle 4, and therefore a malfunction of the door lock being released may occur, or a misoperation in an atmospheric pressure adjusting mechanism may occur.

Moreover, if complicating schemes of the automatic unlocking functions in order to take the countermeasure against misoperations, there are also problems that the complicated schemes can be fitted in a limited space of the door handle 4 etc., and a manufacturing cost also be increased.

(Block Configuration of Door Handle Device)

Figure 15:
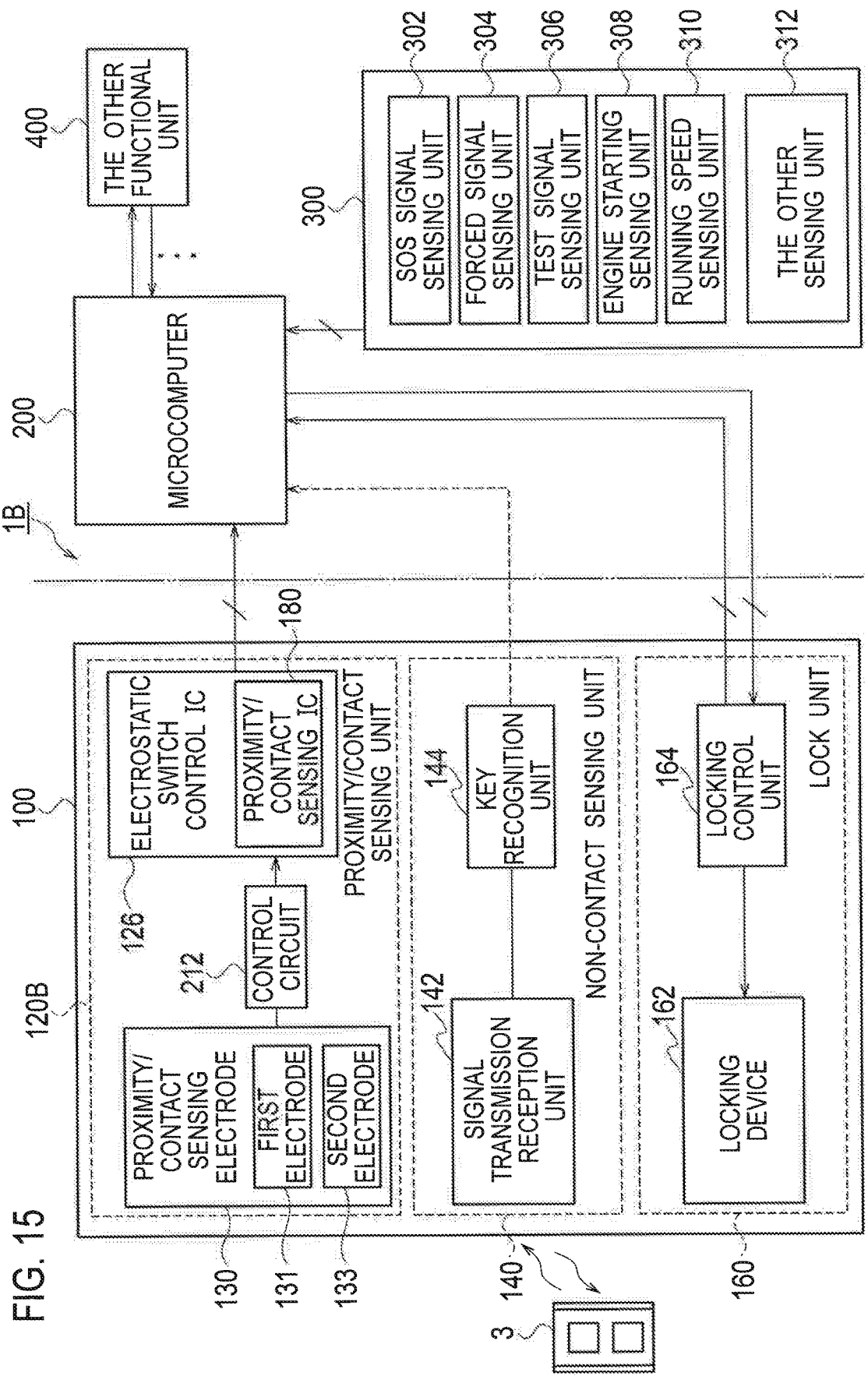
FIG. 15 is an outline block configuration diagram showing a configuration example of a door handle device according to the second embodiment.

FIG. 15 is an outline block configuration diagram showing a configuration example of a door handle device 1B according to the second embodiment.

The door handle device 1B according to the second embodiment discriminates between the human and the rainfall (water droplet) for whom it was difficult to be discriminated until now by modifying a door lock releasing function installed in the door handle 4 in order to improve an accuracy of the sensing determination in accordance with case (pattern) classification, while a fabricating cost of the door handle device etc. is reduced.

The door handle device 1B according to the second embodiment generally includes: a proximity/contact sensing unit 120B including a proximity/contact sensing electrode 130 composed of a first electrode 131 and a second electrode 133 respectively formed so as to be values from which any one or both of an area and sensing sensitivity are different from each other, the proximity/contact sensing electrode 130 configured to sense a proximity or contact to the door handle 4, the proximity/contact sensing unit 120B configured to identify a sensing result sensed by the proximity/contact sensing electrode 130 as a predetermined pattern; a locking unit 160 configured to execute unlocking and locking of a door; and a control unit 200 configured to instruct to the locking unit 160 to keep locking the door if it is determined that the water droplet 9 is in contact with the door handle 4, on the basis of the sensing result identified as the predetermined pattern.

Moreover, the control unit 200 instructs to unlock the door to the locking unit 160, if it is determined that at least a part of the human's 80 body is in contact with the door handle 4 on the basis of the sensing result identified as the predetermined pattern.

As shown in FIG. 15, the door handle device 1B according to the second embodiment includes an opening and closing mechanism unit 100, an other sensing unit 300, an other functional unit 400, and a control unit (microcomputer) 200 configured to control the above-mentioned each unit. The opening and closing mechanism unit 100 includes a proximity/contact sensing unit 120B, a non-contact sensing unit 140, and a locking unit (lock unit) 160. The other sensing unit 300 includes: an SOS signal sensing unit 302, a forced signal sensing unit 304, a test signal sensing unit 306, an engine starting sensing unit 308, a running speed sensing unit 310, and the other sensing unit 312. The engine starting sensing unit 308 and the running speed sensing unit 310 are optional features used when applying the door handle device 1B according to the second embodiment to a traveling means, such as a vehicle, etc.

The proximity/contact sensing unit 120B includes: a proximity/contact sensing electrode 130 including a proximity/contact sensing electrode for switch operation, e.g. an electrostatic capacitance sensor configured to sense an electrostatic capacity; an electrostatic switch control IC 126 configured to control the proximity/contact sensing electrode 130; and a control circuit 212 configured to control the electrostatic switch control IC 126. The electrostatic switch control IC 126 includes a proximity/contact sensing IC 180. The proximity/contact sensing electrode 130 includes a first electrode 131 and a second electrode 133, as mentioned below. The proximity/contact sensing electrode 130 senses whether a human (e.g., hand 8) is in proximity to/contact with the door handle 4 or a raindrop 9 (water or a water droplet: hereafter using in the same meaning as a raindrop) is in proximity to/contact with the door handle 4. More specifically, the proximity/contact sensing electrode 130 senses whether the water droplet, such as a rainfall etc., is in proximity to/contact with the door handle 4, or at least a part of the human's 80 body (e.g., a hand, a finger, etc.) is in proximity to/contact with the door handle 4 when a human 80 performs an opening and closing operation of the door.

The control unit 200 instructs to the locking unit 160 to unlock the door if it is determined that at least a part of the human's 80 body is in proximity to/contact therewith, on the basis of the sensing result sensed by the proximity/contact sensing electrode 130.

The non-contact sensing unit 140 includes: a signal transmission reception unit (signal transmission reception device) 142 configured to transmit/receive a signal to/from an electronic key 3 including a card key, a smart phone, etc., for example, through the antenna 220 (FIGS. 19 and 20); and a key recognition unit 144 configured to recognize a key and a key operation on the basis of the signal transmitted/received by the signal transmission reception unit 142.

The locking unit 160 includes: a locking unit (locking device) 162 configured to lock/unlock a door, etc.; and a locking control unit 164 configured to control the locking/ unlocking with respect to the locking unit 162 on the basis of a sensing signal (data) sensed by the proximity/contact sensing unit 120B, the non-contact sensing unit 140, the other sensing unit 300, etc.

The other functional unit 400 includes various functions, e.g. an air-conditioner function, a car navigation function, an audio/video function, and an illuminating function, for example, and can control the various functions on the basis of the sensing signal (data) sensed by the proximity/contact sensing unit 120B, the non-contact sensing unit 140, the other sensing unit 300, etc.

(Mounting Substrate)

FIG. 16 schematically exemplifies a PCB 210 on which the proximity/contact sensing electrode 130 used for the door handle device 1B according to the second embodiment is installed. FIG. 16A shows an example of installing the first electrode 131 on the mounting substrate 210, FIG. 16B shows an example of installing the second electrode 133 on the mounting substrate 210, and FIG. 16C shows an example of installing the first electrode 131 and the second electrode 133 on the mounting substrate 210.

The door handle device 1B according to the second embodiment uses the electrostatic capacity type proximity/ contact sensing electrode 130. The proximity/contact sensing electrode 130 including two different electrodes, i.e., the first electrode 131 and the second electrode 133.

A first electrode 131 is an electrode installed on an outer periphery of the PCB 210, and the second electrode 133 is installed on places, except for the outer periphery, being as far as possible from the outer periphery of the PCB 210 (e.g., near the center of the PCB 210). Two electrodes, i.e., the first electrode 131 and the second electrode 133, are formed so that any one or both of the area and the sensing sensitivity thereof becomes different values from each other, and are respectively connected to the proximity/contact sensing IC 180 to be installed on the PCB 210.

FIG. 17 shows an illustrative example of a disposed place, the area, and the sensitivity of the proximity/contact sensing electrode 130 (the first electrode 131 and the second electrode 133). In the example shown in FIG. 17, the first electrode 131 is installed on an outer periphery of the PCB 210, and has the sensing sensitivity higher than that of second electrode 133 and the area wider than that of the second electrode 133. On the other hand, the second electrode 133 is installed on a center portion of the PCB 210, and has the sensing sensitivity lower than that of the first electrode 133 and the area narrower than that of the first electrode 133. Upon forming the first electrode 131 and the second electrode 133 in this way, a distance by which the first electrode 131 can sense the "proximity" of the human's 80 hand 8 is adjusted, for example to approximately 0 cm to approximately 30 cm, and a distance by which the second electrode 133 can sense the "proximity" of the human's 80 hand 8 is adjusted, for example to approximately 0 cm to approximately 10 cm, which is shorter than the distance for the first electrode 131. If the distance is 0 cm, the electrode senses the "contact" rather than the "proximity."

Thus, by setting the area and the sensitivity of each of the first electrode 131 and the second electrode 133 to a different value mutually, characterization and case classification can be realized for the sensing result of the object, and thereby the hand 8 and the water droplet can be identified.

Moreover, Since not only the "contact" sensing but also the "proximity" sensing can be achieved, and thereby the hand 8 does not need to be in directly contact with the proximity/contact sensing electrode 130, a positional restriction of the proximity/contact sensing electrode 130 to be disposed can be reduced (a positional flexibility of the electrodes to be disposed can be improved).

(Proximity/Contact Sensing Electrode)

Figure 18A:
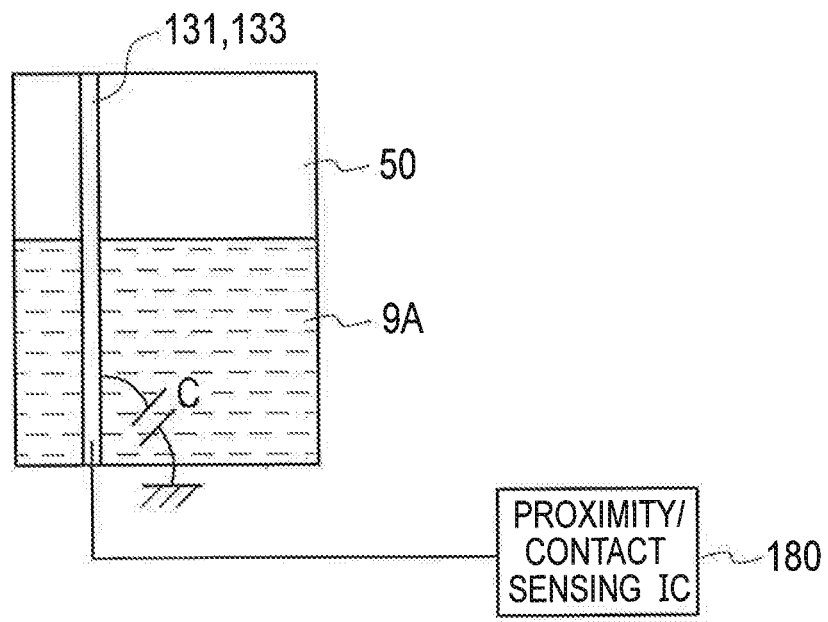
FIG. 18A is a schematic diagram for schematically exemplifying a sensing mechanism of the proximity/contact sensing electrode in the second embodiment, which is an example of a mechanism for sensing a volume of water (water level).
Figure 18B:
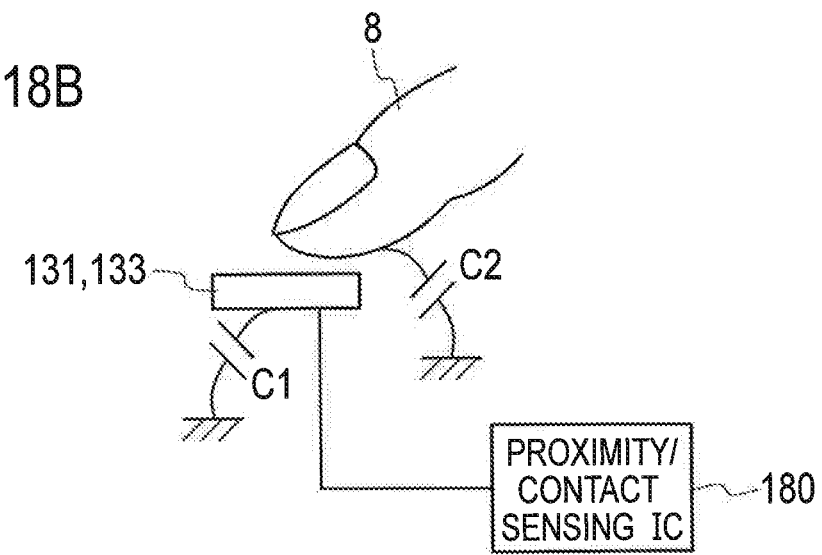
FIG. 18B is a schematic diagram for schematically exemplifying a sensing mechanism of the proximity/contact sensing electrode in the second embodiment, which is an example of a mechanism for sensing proximity or contact of a human body (hand).
Figure 18C:
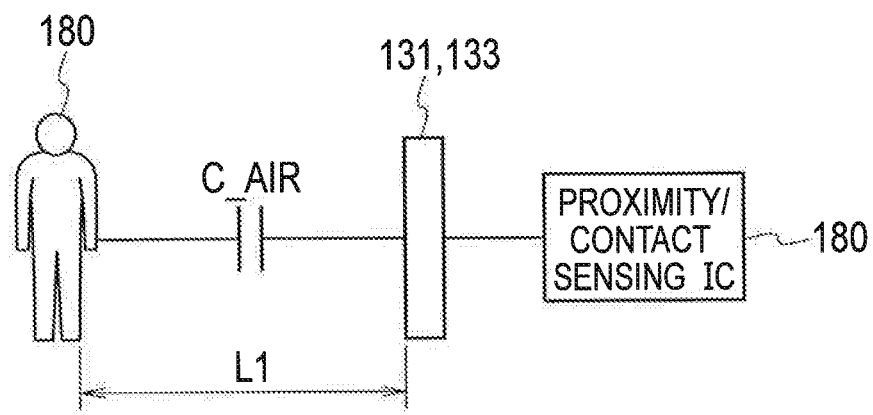
FIG. 18C is a schematic diagram for schematically exemplifying a sensing mechanism of the proximity/contact sensing electrode in the second embodiment, which is an example of a mechanism for sensing proximity of a human body (hand).

FIG. 18 shows a sensing mechanism of the proximity/ contact sensing electrode 130 (the first electrode 131 and the second electrode 133) used in the proximity/contact sensing unit 120B of the door handle device 1B according to the second embodiment. FIG. 18A shows an example of a mechanism for sensing a volume of water (water level) 9A which exists in a certain container 50, FIG. 18B shows an example of a mechanism for sensing a human's 80 hand 8, and FIG. 18C shows an example of a mechanism for sensing proximity of the hand 8.

As shown in FIG. 18A, the proximity/contact sensing electrode 130 used in the second embodiment is installed the outside or inside of the certain container 50, or is built in the container 50. The proximity/contact sensing electrode 130 is installed or built therein at a predetermined distance from the water 9A (i.e., at least a minimum required distance to sense the existence of the water 9A by the proximity/contact sensing electrode 130 (e.g., approximately 1 to approximately 2 mm)). As the proximity/contact sensing electrode 130, an electrostatic capacity type sensing electrode can be used, for example, the electrostatic capacity type sensing electrode is an electrode for sensing the presence or absence of the water 9A with respect to the proximity/contact sensing electrode 130 as change of the electrostatic capacity. The container 50 is grounded. Moreover, a reference capacity C used as the reference for calibrations is provided therein, and the proximity/contact sensing IC 180 connected to the proximity/contact sensing electrode 130 is configured to compare an electrostatic capacity sensed by the proximity/ contact sensing electrode 130, and the reference capacity C, in order to sense a volume of water 9A (water level) in the container 50.

If the container 50 shown in FIG. 18A is replaced by the door handle 4 used in the second embodiment, and the water 9A in the container 50 show in FIG. 18A is replaced by the water droplet adhered to the door handle 4 used in the second embodiment, then the proximity/contact sensing IC 180 can determine whether or not the water droplet is adhered to the proximity/contact sensing electrode 130 (i.e., door handle 4). More specifically, since the electrostatic capacity sensed by the proximity/contact sensing electrode 130 changes in accordance with the variation of the quantity (area) of water droplets adhered with respect to the size (area) of the electrode, the proximity/contact sensing IC 180 determines whether or not the water droplet is adhered to the proximity/contact sensing electrode 130 (i.e., door handle 4) by monitoring the change of the electrostatic capacity value sensed by the proximity/contact sensing electrode 130.

Moreover, the contact sensing LSI 20 senses whether or not the human's 80 hand 8 is contacted with the proximity/ contact sensing electrode 130 by sensing change of the stray capacitance C1 exemplified in FIG. 18B.

Moreover, the contact sensing LSI 20 senses whether or not the human's 80 hand 8 is in proximity to and then in contact with the proximity/contact sensing electrode 130 by sensing change of the electrostatic capacity C_AIR which occurs between the proximity/contact sensing electrode 130 and the human 80 (hand 8) shown in FIG. 18C. In addition, a distance L1 by which the first electrode 131 can sense the "proximity" of the human's 80 hand 8 is adjusted, for example to approximately 0 cm to approximately 30 cm, and a distance L1 by which the second electrode 133 can sense the "proximity" of the human's 80 hand 8 is adjusted, for example to approximately 0 cm to approximately 10 cm, which is shorter than the distance for the first electrode 131.

Figure 19:
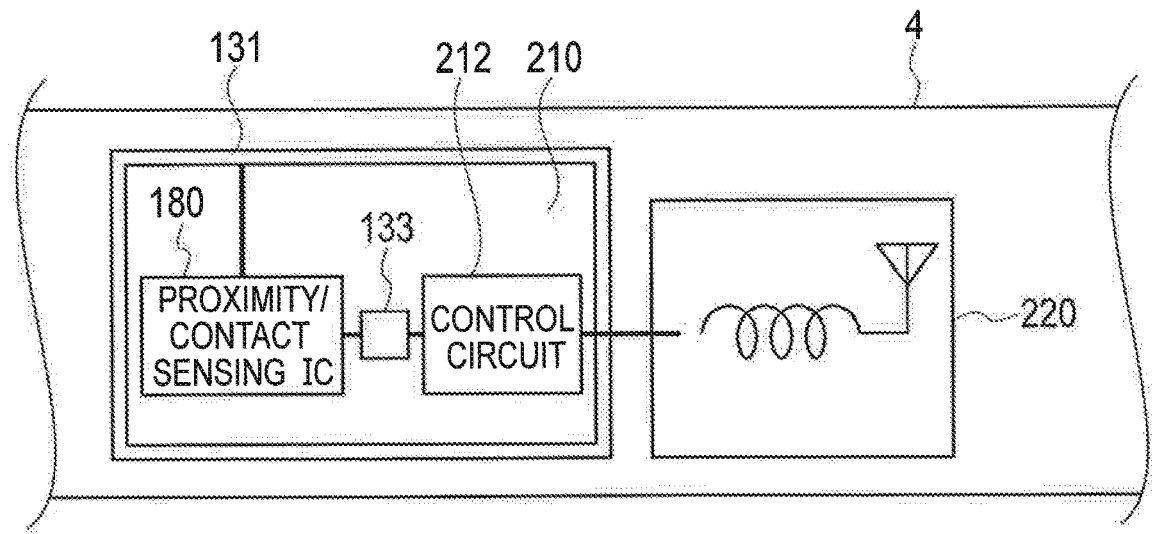
FIG. 19 is a schematic diagram showing an example of disposing a mounting substrate, on which the proximity/contact sensing electrode in the second embodiment is installed, in the door handle.

FIG. 19 schematically shows an example of disposing a mounting substrate 210 in the door handle 4 so as to be adjacent to the antenna 220, wherein the proximity/contact sensing electrode 130 (the first electrode 131 and the second electrode 133) in the second embodiment is installed on the mounting substrate 210.

The antenna 220 is provided in the signal transmission reception unit 142 shown in FIG. 15, and is used for wireless communications with the electronic key 3 (FIGS. 15 and 20) carried by the humans 80, e.g. a driver. The antenna 220 used for transmitting/receiving an identifying signal for sensing that the human 80 who carries the electronic key 3, for example, is in proximity to the vehicle (door handle 4), to/from the electronic keys 3, an authentication signal for authenticating a validity of the electronic key 3, an unlocking/locking signal for unlocking/locking the door lock, etc.

As shown in FIG. 19, since the proximity/contact sensing electrode 130 is embedded (installed) in the PCB 210, the number of wiring, terminals, etc. to be disposed between the PCB 210 and the proximity/contact sensing electrode 130 can be reduced, and thereby a place for embedding/fixing the proximity/contact sensing electrode 130 in the door handle 4 can be secured, and working man-hours therefor can be reduced.

Figure 20:
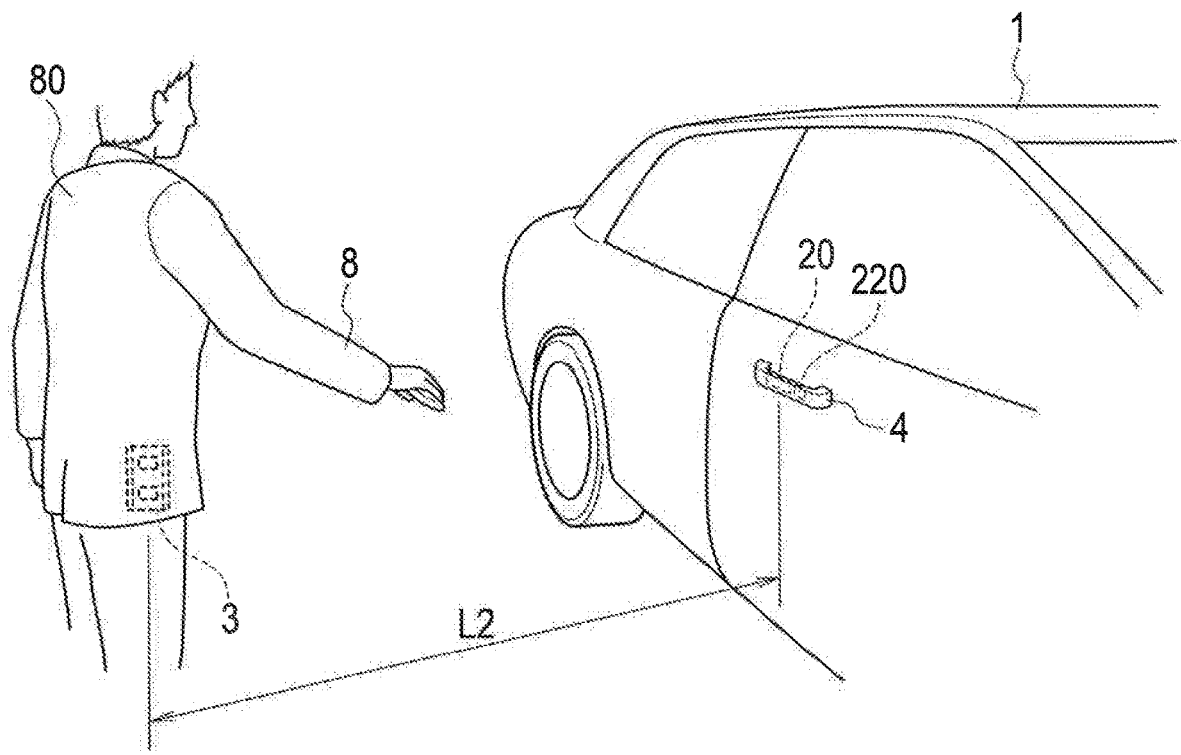
FIG. 20 is a schematic diagram for schematically exemplifying an aspect that a vehicle including an electronic key system according to the second embodiment is operated.

FIG. 20 schematically exemplifies an aspect of operating a vehicle including an electronic key system according to the second embodiment. When the human 80 (e.g., driver etc.) who carries the electronic key 3 (attached to the body) enters within an operation range L2 capable of receiving a signal currently sent from the vehicle side (a range capable of recognizing the existence of the owner 80), the electronic key 3 and the non-contact sensing unit 140 in the vehicle will transmit and receive the signals through the antenna 220. The operation range L2 is set to approximately 1 mm to approximately 3 m in radius, for example.

(Sensing Determination in Accordance with Case (Pattern) Classification)
(Pattern 1)

Figure 21A:
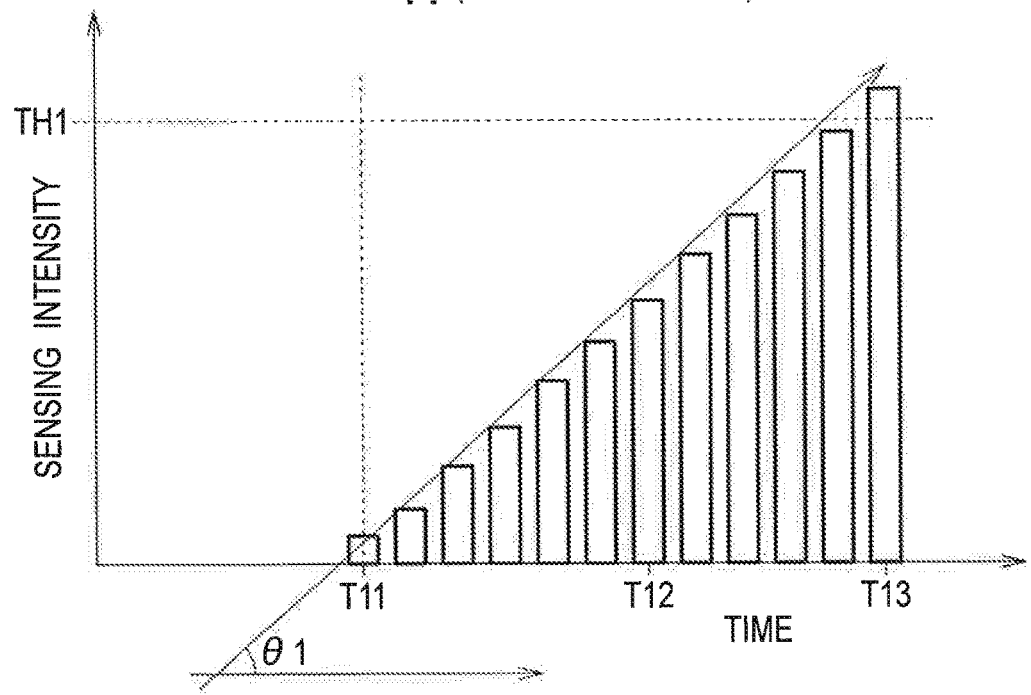
FIG. 21A is a schematic diagram for schematically exemplifying an example (pattern 1) of a sensing result (sensed capacitance) by the proximity/contact sensing electrode in the second embodiment, which is an example of a sensing result sensed by the first electrode.
Figure 21B:
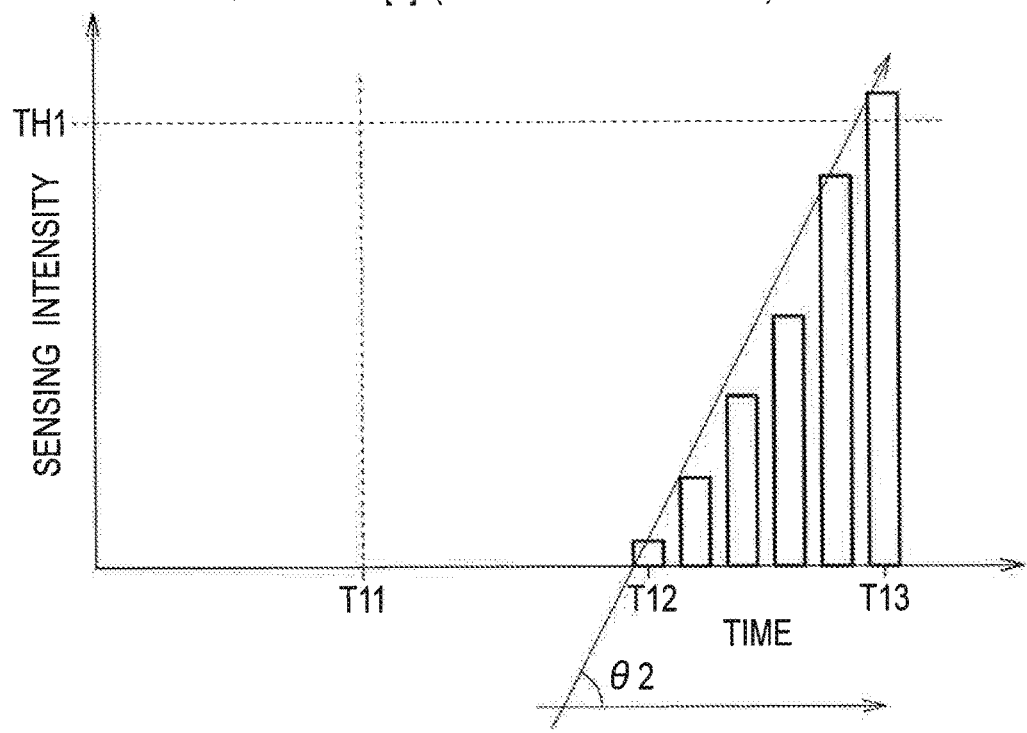
FIG. 21B is a schematic diagram for schematically exemplifying an example (pattern 1) of a sensing result (sensed capacitance) by the proximity/contact sensing electrode in the second embodiment, which is an example of a sensing result sensed by the second electrode.

FIG. 21 schematically exemplifies an example (pattern 1) of a sensing result (sensed capacitance) sensed by the proximity/contact sensing electrode 130 (the first electrode 131 and the second electrode 133) in the second embodiment. FIG. 21A shows an example of a sensing result sensed by the first electrode 131, and FIG. 21B shows an example of a sensing result sensed by the second electrode 133.

The pattern 1 is a pattern where the human 80 is in proximity to the door handle 4 in a situation where it is not raining, and then in contact with the door handle 4 after that (with an intention of unlocking), and can be characterized as follows:

(1) During after the human 80 who carries the electronic key 3 (attached to the body) enters within the operation range L2 until the first electrode 131 enters within a range L1 capable of sensing a human 80 (hand 8) proximity (at time T11 in FIG. 21), there is nothing to be sensed by the first electrode 13 and the second electrodes 133.

(2) At time T11, if the human 80 (hand 8) enters within the sensing range L1 of the first electrode 131 (for example, not more than approximately 30 cm), the first electrode 131 having higher sensitivity and larger area as compared with the second electrode 133 begins to sense the proximity of the human 80 (hand 8).

(3) Subsequently, at time T12, if the human 80 (hand 8) enters within the sensing range L1 of the second electrode 133 (for example, not more than approximately 10 cm), the second electrode 133 having lower sensitivity and smaller area as compared with the first electrode 131 also begins to sense the proximity of the human 80 (hand 8).

(4) Subsequently, at time T13, if the hand 8 is in contact with the door handle 4 (i.e., the first electrode 131 and the second electrode 133), the respective sensed capacitance values of the first electrode 131 and the second electrode 133 will be in a state where it is stabilized after exceeding the threshold value for determination TH1.

(5) Although the start timing of proximity sensing (time T12) by the second electrode 133 is later than the start timing of proximity sensing (time T11) by the first electrode 131, the start timing of contact sensing (time T13) by the second electrode 133 is the same as that (time T13) by the first electrode 131. Accordingly, an angle of sensing trajectory (θ2) of the second electrode 133 becomes steeper than an angle of sensing trajectory (θ1) of the first electrode 131 (θ1<θ2).

(Pattern 2)

Figure 22A:
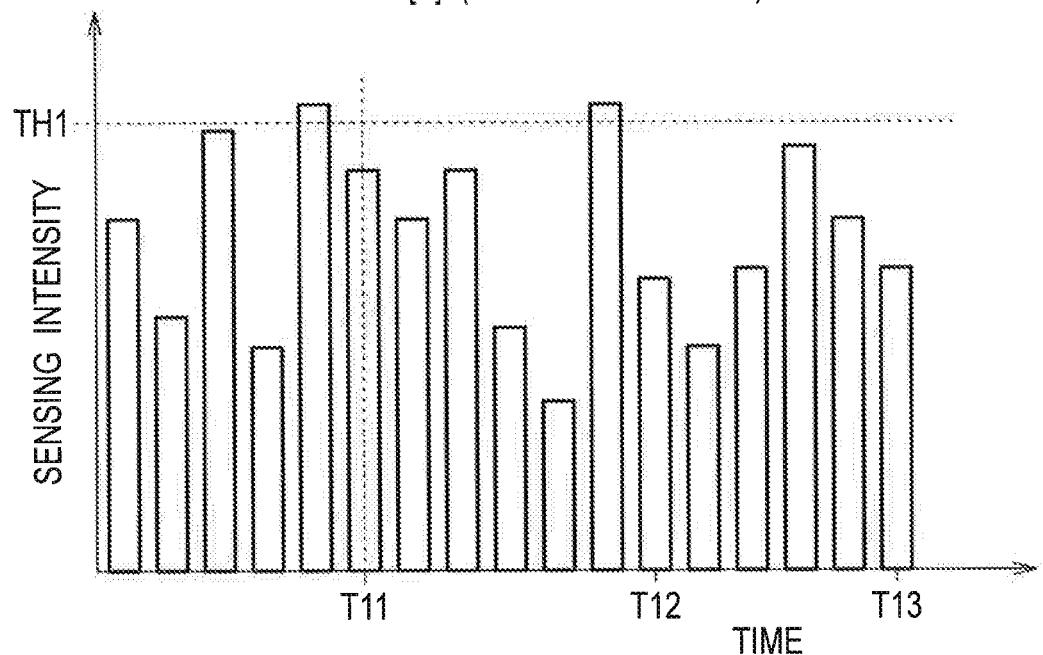
FIG. 22A is a schematic diagram for schematically exemplifying an example (pattern 2) of a sensing result (sensed capacitance) by the proximity/contact sensing electrode in the second embodiment, which is an example of a sensing result sensed by the first electrode.
Figure 22B:
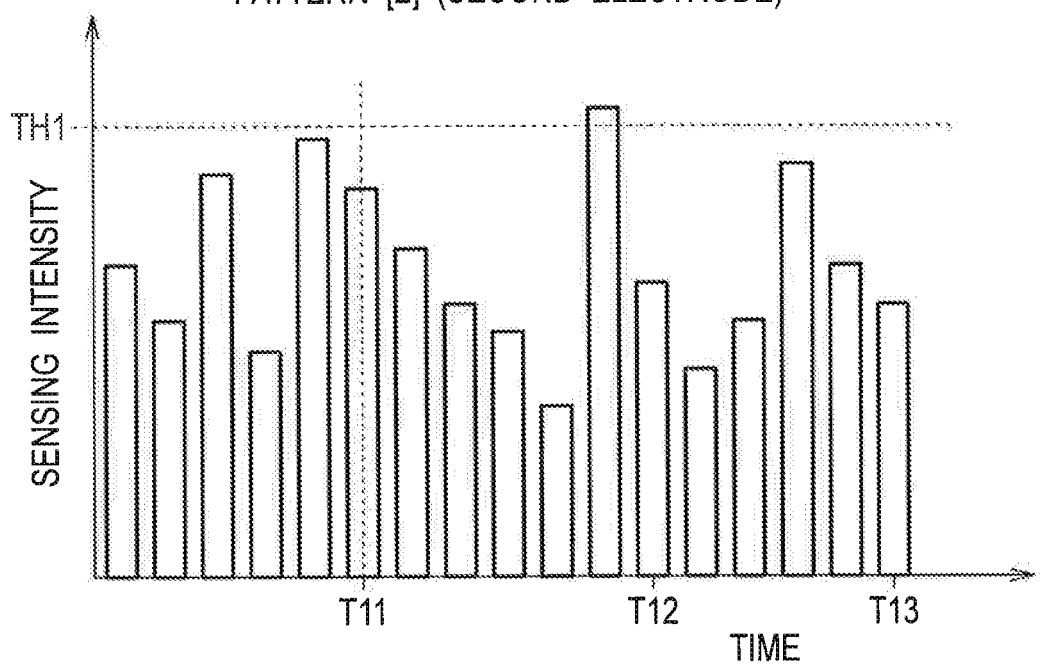
FIG. 22B is a schematic diagram for schematically exemplifying an example (pattern 2) of a sensing result (sensed capacitance) by the proximity/contact sensing electrode in the second embodiment, which is an example of a sensing result sensed by the second electrode.

FIG. 22 schematically exemplifies an example (pattern 2) of a sensing result (sensed capacitance) sensed by the proximity/contact sensing electrode 130 (the first electrode 131 and the second electrode 133) in the second embodiment. FIG. 22A shows an example of a sensing result sensed by the first electrode 131, and FIG. 22B shows an example of a sensing result sensed by the second electrode 133.

The pattern 2 is a situation pattern where relatively heavy rain falls (without intention of unlocking by a human), and can be characterized as follows:

(1) Immediately after the human 80 who carries the electronic key 3 (attached to the body) enters within the operation range L2, both of the first electrode 131 and the second electrode 133 begin to sense proximity/contact.

(2) As a sensing result of the first electrode 131 and as a sensing result of the second electrode 133, no tendency is particularly observed, there are unstable sensing results. However, since a water droplet will fall on similarly both of the first electrode 131 and the second electrode 133 if it is heavy rain, there are observed trajectories similar with each other in the sensing result of the first electrode 131 and the sensing result of the second electrode 133, while each sensing result is instability.

(Pattern 3)

Figure 23A:
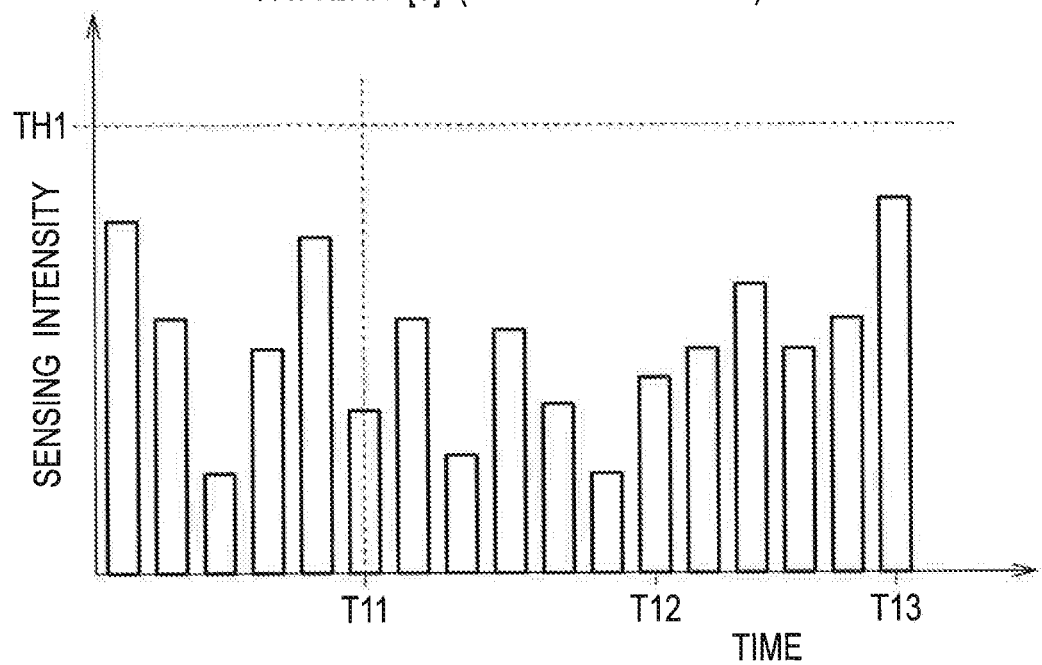
FIG. 23A is a schematic diagram for schematically exemplifying an example (pattern 3) of a sensing result (sensed capacitance) by the proximity/contact sensing electrode in the second embodiment, which is an example of a sensing result sensed by the first electrode.
Figure 23B:
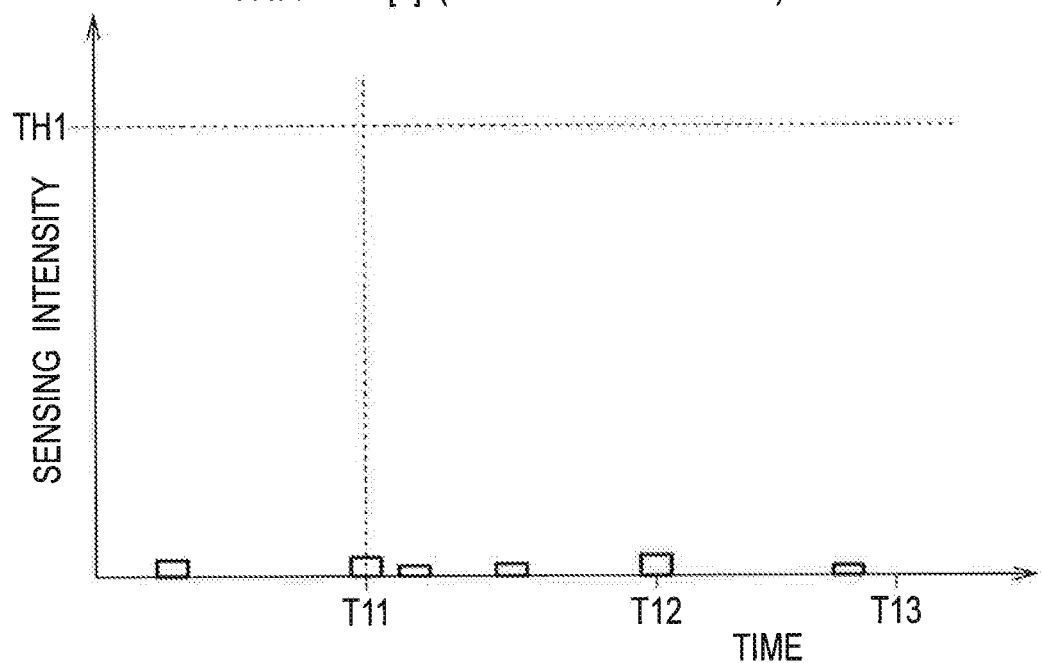
FIG. 23B is a schematic diagram for schematically exemplifying an example (pattern 3) of a sensing result (sensed capacitance) by the proximity/contact sensing electrode in the second embodiment, which is an example of a sensing result sensed by the second electrode.

FIG. 23 schematically exemplifies an example (pattern 3) of a sensing result (sensed capacitance) sensed by the proximity/contact sensing electrode 130 (the first electrode 131 and the second electrode 133) in the second embodiment. FIG. 23A shows an example of a sensing result sensed by the first electrode 131, and FIG. 23B shows an example of a sensing result sensed by the second electrode 133.

The pattern 3 is a situation pattern where relatively light rain falls (without intention of unlocking by a human), and can be characterized as follows:

(1) Immediately after the human 80 who carries the electronic key 3 (attached to the body) enters within the operation range L2, both of the first electrode 131 and the second electrode 133 begin to sense proximity/contact.

(2) As a sensing result of the first electrode 131 and as a sensing result of the second electrode 133, no tendency is particularly observed, there are unstable sensing results. However, since the water droplet easily falls on the first electrode 131 if it is light rain, but the water droplet hardly falls on the second electrode 133, there is a tendency to hardly be sensed by the second electrode 133. No trajectory similar with each other is observed in between the sensing result of the first electrode 131 and the sensing result of the second electrode 133.

(Pattern 2B)

Figure 24A:
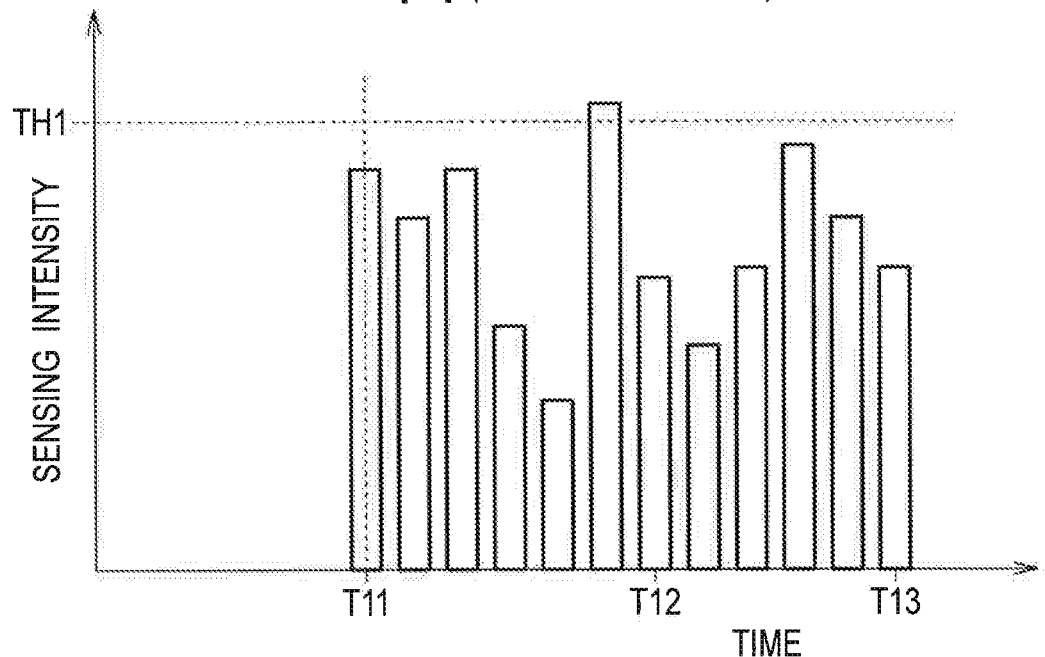
FIG. 24A is a schematic diagram for schematically exemplifying an example (pattern 2B) of a sensing result (sensed capacitance) by the proximity/contact sensing electrode in the second embodiment, which is an example of a sensing result sensed by the first electrode.
Figure 24B:
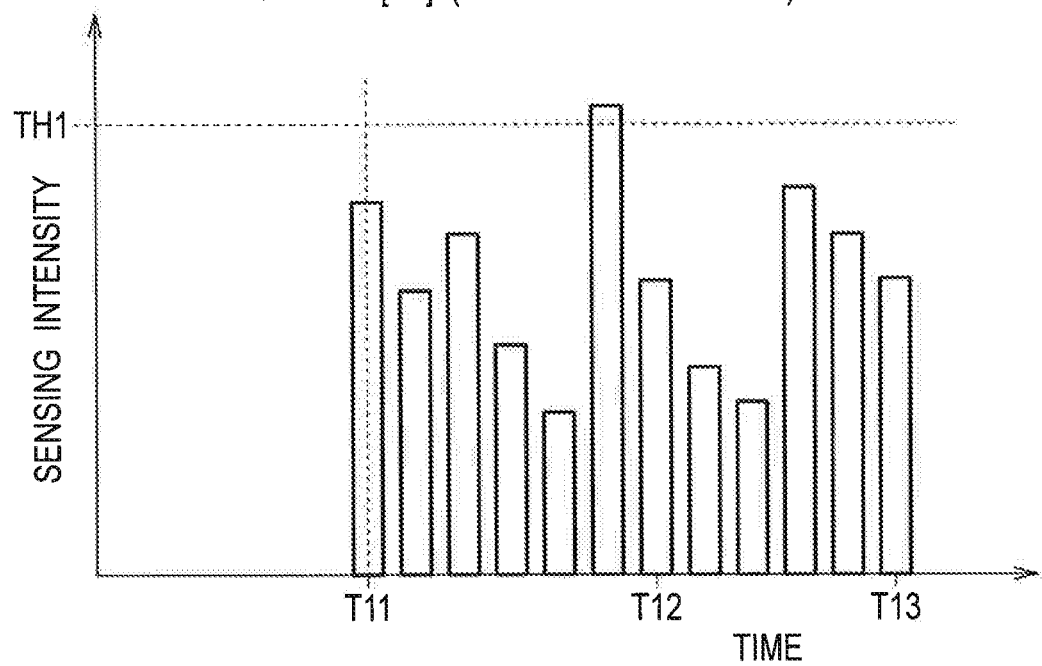
FIG. 24B is a schematic diagram for schematically exemplifying an example (pattern 2B) of a sensing result (sensed capacitance) by the proximity/contact sensing electrode in the second embodiment, which is an example of a sensing result sensed by the second electrode.

FIG. 24 schematically exemplifies an example (pattern 2B) of a sensing result (sensed capacitance) sensed by the proximity/contact sensing electrode 130 (the first electrode 131 and the second electrode 133) in the second embodiment. FIG. 24A shows an example of a sensing result sensed by the first electrode 131, and FIG. 24B shows an example of a sensing result sensed by the second electrode 133.

Pattern 2B is a pattern in which water is in contact therewith (for example, a car is washed, without intention of unlocking), although a human 80 is in proximity thereto (stay in proximity thereto), and can be characterized as follows:

(1) During after the human 80 who carries the electronic key 3 (attached to the body) enters within the operation range L2 until car washing is started (at time T11), there is nothing to be sensed by the first electrode 13 and the second electrodes 133.

(2) Subsequently, when the car washing is started at time T11, each of the first electrode 131 and the second electrode 133 begins to executing the sensing.

(3) As a sensing result of the first electrode 131 and as a sensing result of the second electrode 133, no tendency is particularly observed, there are unstable sensing results. However, since a water droplet will fall on similarly both of the first electrode 131 and the second electrode 133 if there is a larger volume of water such as car washing, there are observed trajectories similar with each other in the sensing result of the first electrode 131 and the sensing result of the second electrode 133, while each sensing result is instability.

(Block Configuration of Proximity/Contact Sensing IC)

Figure 25:
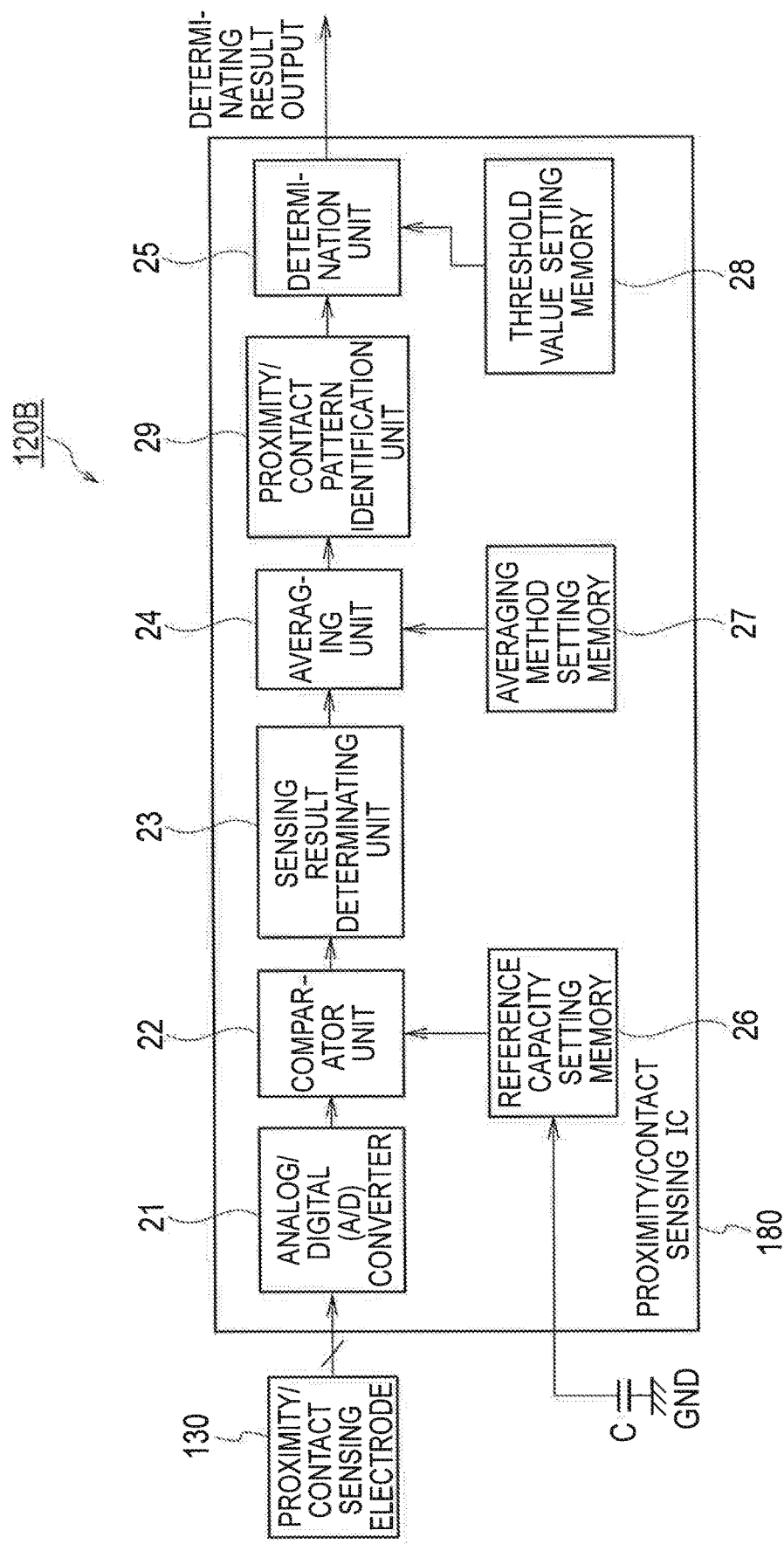
FIG. 25 is a schematic block diagram for exemplifying a configuration example of the proximity/contact sensing IC in the proximity/contact sensing unit according to the second embodiment.

FIG. 25 is a schematic block diagram for exemplifying a configuration example of the proximity/contact sensing IC 180 in the proximity/contact sensing unit 120B according to the second embodiment.

The proximity/contact sensing IC 180 includes: an analog/digital (A/D) converter 21 configured to convert a sensing result (sensed capacitance) sensed by a proximity/contact sensing electrode 130 (a first electrode 131 and a second electrode 133) configured to sense a proximity to or contact with a door handle 4 from analog data into digital data; a comparator unit 22 configured to compare a sensed capacitance value output from the A/D converter 21 with a reference capacity (dummy capacitance) value for calibrations stored in a reference capacity setting memory 26; a sensing result determinating unit 23 configured to determine whether or not something is in proximity to/contact with the proximity/contact sensing electrode 130 on the basis of a comparison result output from the comparator unit 22; an averaging unit 24 configured to execute averaging processing with respect to the sensing result on the basis of various kinds of set values of an averaging method (averaging filter) stored in an averaging method setting memory 27; a proximity/contact pattern identification unit 29 configured to identify a predetermined pattern 1, pattern 2, pattern 2B, and pattern 3 shown in FIGS. 21-24 while averaging etc. are executed by the averaging unit 24; and a determination unit 25 configured to determine whether a human's 80 hand 8 is in contact with the proximity/contact sensing electrode 130 (i.e., the door handle 4) or a water droplet is in contact with the proximity/contact sensing electrode 130 on the basis of a sensing result subjected to the averaging etc. by the averaging unit 24, a pattern identified by the proximity/contact pattern identification unit 29, and a predetermined threshold value stored in a threshold value setting memory 28 (FIG. 27). A determination threshold value TH1 shown in FIGS. 21-24 is set up and stored in the threshold value setting memory 28.

Since the reference capacity value is different for every system in accordance with wirings, circuits, etc. actually disposed in the door handle 4, the reference capacity value and a storing method to the reference capacity setting memory 26 are reviewed to be determined at the time of system construction (design). For example, the reference capacity setting memory 26 can be composed as a read-only memory (ROM) if the reference capacity value can be previously specified, but the reference capacity setting memory 26 can be composed as a random access memory (RAM) since a value of the reference capacity C is stored each time at the time of operation start if the reference capacity value cannot be previously specified.

(Application Circuit (Proximity/Contact Sensing Device) Configuration of Proximity/Contact Sensing Unit)

Figure 26:
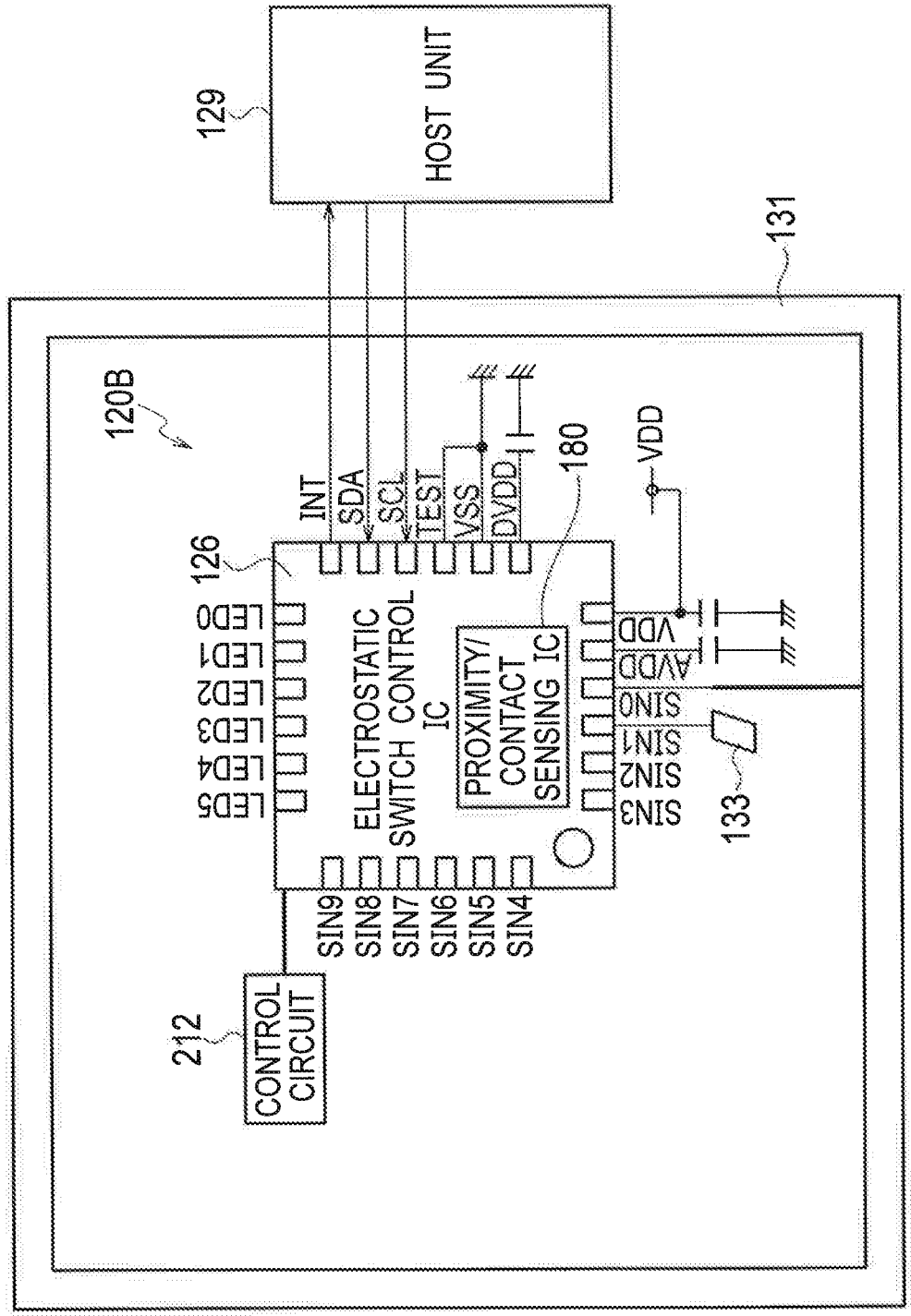
FIG. 26 is a schematic block diagram for exemplifying a configuration example of the application circuit configuration in the proximity/contact sensing unit according to the second embodiment.

FIG. 26 is a schematic block diagram for exemplifying a configuration example of the application circuit configuration (PCB 210 (proximity/contact sensing device)) of the proximity/contact sensing unit 120B according to the second embodiment.

As shown in FIG. 26, the application circuit configuration of the proximity/contact sensing unit 120B includes: an electrostatic switch control IC 126; a proximity/contact sensing electrode 130 (a first electrode 131 and a second electrode 133) connected to the electrostatic switch control IC 126; and a control circuit 212 configured to control the electrostatic switch control IC 126, wherein the electrostatic switch control IC 126 includes a proximity/contact sensing IC 180. The electrostatic switch control IC 126 is connected to a host unit 129, e.g. an electronic apparatus of the electronic key system.

The electrostatic switch control IC 126 is a controller for the electrostatic capacitance sensor for switch operation of the proximity/contact sensing electrode 130.

The electrostatic switch control IC 126 can include: Analog Front End (AFE) for sensing the electrostatic capacity; an A/D converter for converting the sensed capacity into a digital sensed value; a Micro Processing Unit (MPU) for processing a sensed value; a Light Emitting Diode (LED) controller supporting a Pulse Width Modulation (PWM) wave; a two-wire serial bus host interface supporting Inter-Integrated Circuit (I2C) bus protocol; power on reset; a clock oscillation circuit; an internal Low Drop-Out regulator (LDO), etc.

In the electrostatic switch control IC 126, one electrostatic capacitance sensor can be used as one independent switch (i.e., independent proximity/contact sensing electrode 130) as shown in FIG. 24. ON, OFF, long pressing operations, etc. can be recognized in each of the independent sensing sensors.

The sensing sensitivity (refer to FIG. 17) of the proximity/contact sensing electrode 130 (the first electrode 131 and the second electrode 133) is adjustable by adjusting a resolution of AFE.

(Control Method of Door Handle Device)

FIG. 27 shows an example of a pattern classification of a sensing result sensed by the proximity/contact sensing electrode 130 (the first electrode 131 and the second electrode 133) in the second embodiment. Moreover, FIG. 28 exemplifies a processing procedure for discriminating proximity to or contact with the door handle 4 in order to lock/unlock the door, in the door handle device 1B according to the second embodiment.

In Step S100, if a human (driver etc.) who carried the electronic key 3 (attached to the body) enter within a range (operation range) capable of receiving a signal currently sent from a vehicle side, the electronic key 3 and the non-contact sensing unit 140 in the vehicle begin to transmit and receive signals via the antenna 220 to/from each other, and then a system is started (Step S200).

In Step S201, the control unit 200 determines whether or not an engine of the vehicle is started on the basis of a sensing signal from the engine starting sensing unit 308. If the engine of the vehicle has been started, then, in Step S202, the control unit 200 determines whether or not the vehicle is stopped on the basis of the sensing signal output from the running speed sensing unit 310. If the vehicle 1 is driving, i.e., if the vehicle is not stopped, in Step S210, the control unit 200 transmits an instruction to the locking control unit 164 to keep the locking unit 162 in a locking state.

On the other hand, if determining that the engine of the vehicle 1 is not started in Step S201 (i.e., the engine is stopped), or if determining that the vehicle 1 is stopped although the engine of the vehicle 1 is started in Step S202, then the processing goes to Step S203.

In Step S203, the control unit 200 determines whether or not a signal to release the lock (unlocking signal) is transmitted from the electronic key 3 to the non-contact sensing unit 140 through the antenna 220, and the control unit 200 transmits an instruction to the locking control unit 164 to unlock the locking unit 162, in Step S210, if the unlocking signal is transmitted.

In Step S203, if the signal to release the lock (unlocking signal) is not transmitted from the electronic key 3, then the processing goes to the steps in and after Step S204 in the proximity/contact sensing IC 180 of the proximity/contact sensing unit 120B.

In Step S204, the proximity/contact sensing IC 180 sets up a reference capacity (dummy capacitance) value for calibration. More specifically, a value previously stored in the reference capacity setting memory 26 is used as the sensing maximum Int_MAX (state of full) to be sensed by the proximity/contact sensing electrode 130, or the reference capacity (dummy capacitance) C is set as the sensing maximum Int_MAX (state of full) used for this processing, and then is stored in the reference capacity setting memory 26.

Next, in Step S205, the comparator unit 22 compares the sensed capacitance value sensed by the proximity/contact sensing electrode 130 with the reference capacity (dummy capacitance) value for calibration stored in the reference capacity setting memory 26.

Next, in Step S206, the sensing result determinating unit 23 determines whether or not something is in proximity to/contact with the proximity/contact sensing electrode 130 (the first electrode 131 and the second electrode 133) on the basis of the comparison result output from the comparator unit 22. If nothing is in proximity to/contact with the proximity/contact sensing electrode 130 (the first electrode 131 and the second electrode 133), the processing may go to Step S210 skipping the processing after Step S207.

Next, in Step S207, the averaging unit 24 executes averaging processing etc. with respect to the sensing result, on the basis of various kinds of the set value for averaging methods already stored in the averaging method setting memory 27.

Next, in Step S208, the proximity/contact pattern identification unit 29 identifies the pattern 1, the pattern 2, the pattern 2B, and the pattern 3 shown in FIGS. 21-24, while the averaging etc. is executed by the averaging unit 24.

Next, in Step S209, the determination unit 25 determines whether the human's 80 hand 8 is in contact with the proximity/contact sensing electrode 130 (i.e., the door handle 4) or the water droplet is in contact with the proximity/contact sensing electrode 130, on the basis of a sensing result subjected to the averaging etc. by the averaging unit 24, a pattern identified by the proximity/contact pattern identification unit 29, and a predetermined threshold value stored in a threshold value setting memory 28. If the determination unit 25 can determine that the human's 80 hand 8 is in proximity to/contact with the proximity/contact sensing electrode 130 and the human 80 has an intention of unlocking, the processing goes to Step S211 in order to release the door lock. Conversely, if the water droplet is in contact with the proximity/contact sensing electrode 130, the processing goes to Step S210 in order to keep to the locking unit 162 in the locked state.

Figure 28:
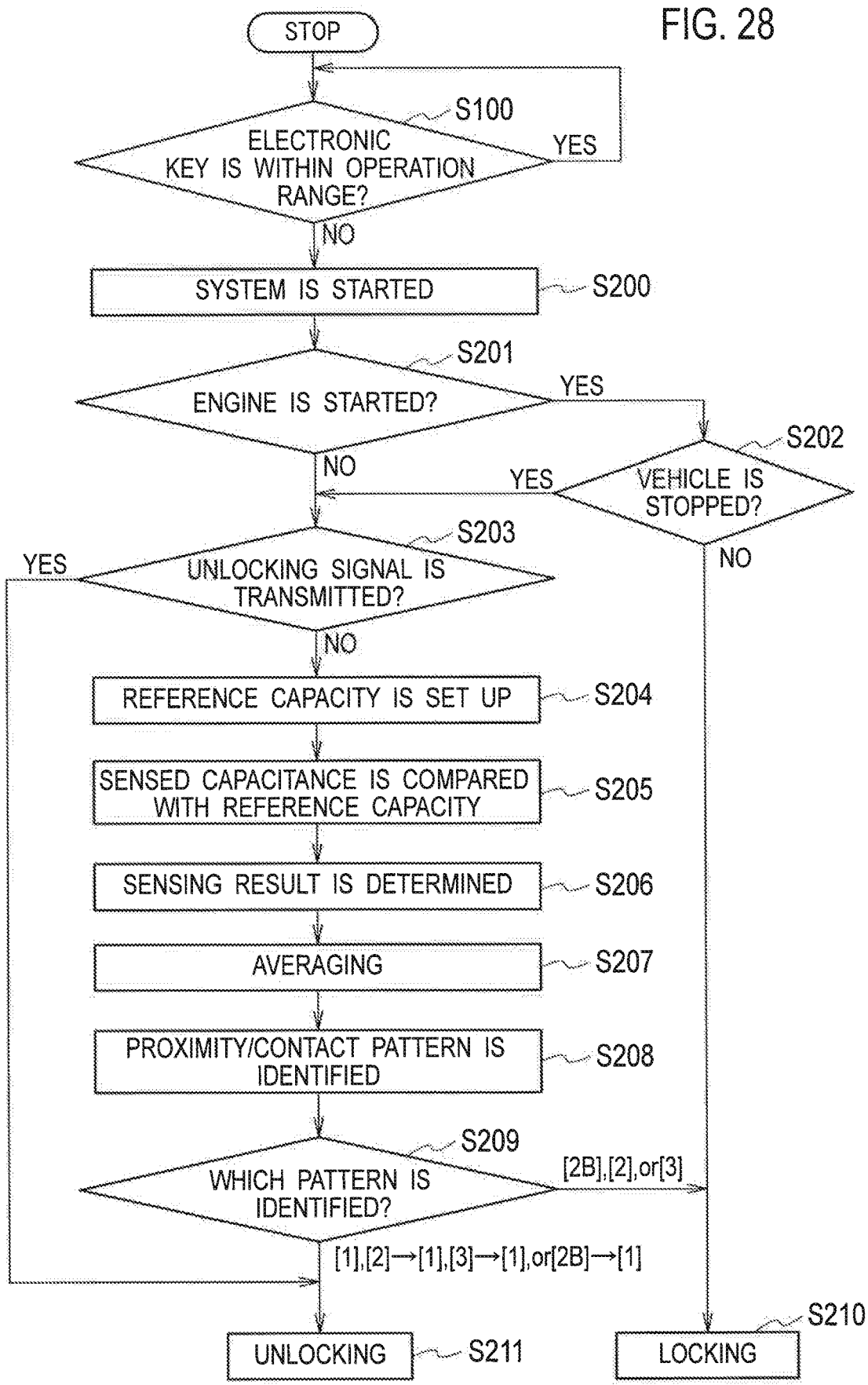
FIG. 28 is an outline flowchart for exemplifying a processing procedure for discriminating a proximity or contact with the door handle in order to lock/unlock the door, in the door handle device according to the second embodiment.
Figure 29:
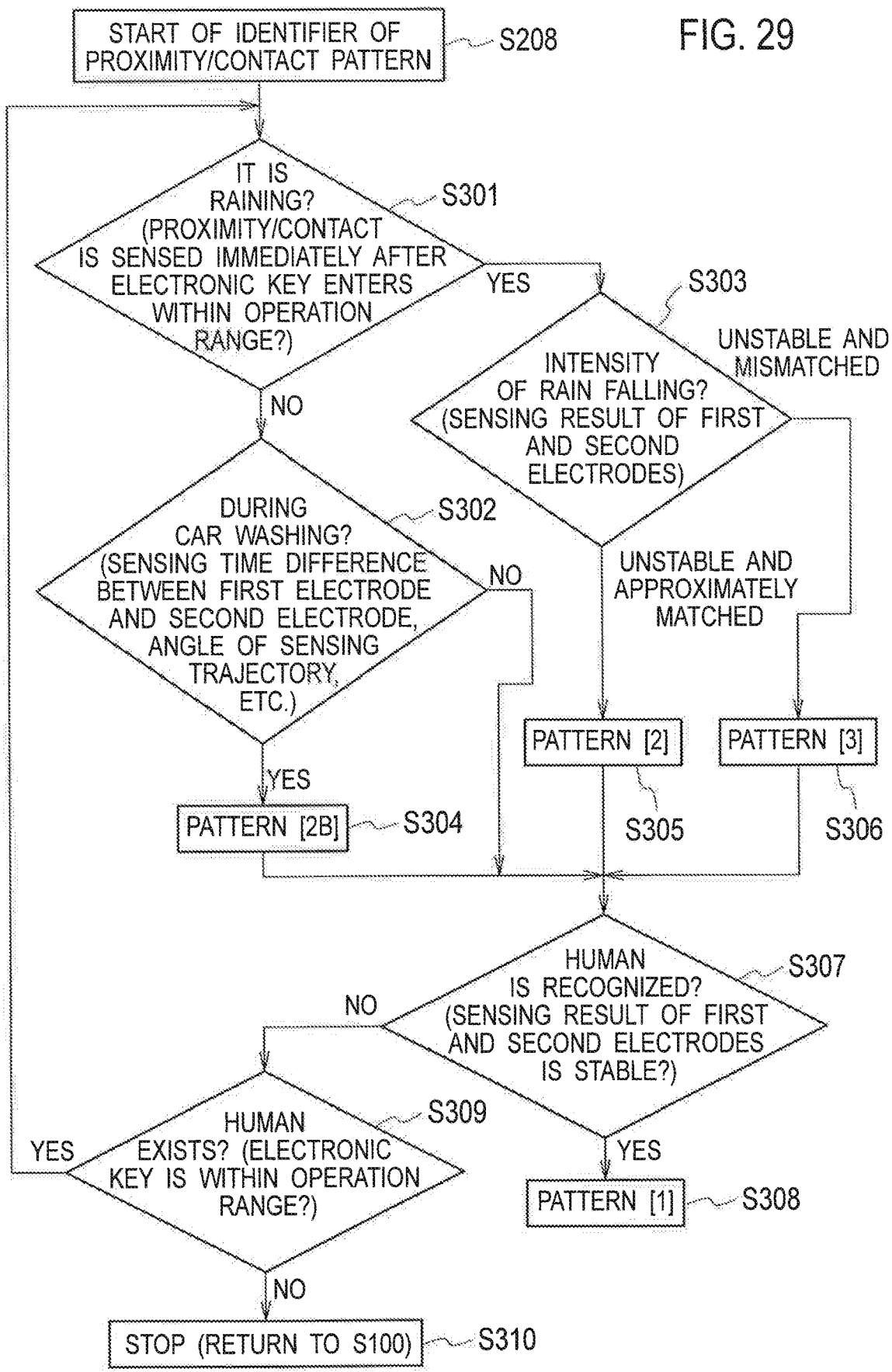
FIG. 29 is an outline flowchart for exemplifying a detailed processing procedure of an identification processing of the proximity/contact pattern in the processing procedure shown in FIG. 28.

With reference to FIG. 29, FIG. 29 shows a detailed processing procedure from Step S208 to Step S209 in the processing procedure shown in FIG. 28.

In Step S301, the proximity/contact pattern identification unit 29 determines whether or not it is raining. More specifically, the proximity/contact pattern identification unit 29 determines whether or not at least one side of the first electrode 131 and the second electrode 133 begins to sense the proximity/contact, immediately after the human 80 who carries the electronic key 3 enters within the operation range L2.

As a result of the determination in Step S301, if it is not raining, next, in Step S302, the proximity/contact pattern identification unit 29 determines whether or not car washing is conducted. More specifically, the proximity/contact pattern identification unit 29 determines (a) whether or not the start timing of proximity sensing (time T12) by the second electrode 133 is later than the start timing of proximity sensing (time T11) by the first electrode 131, or (b) whether or not the angle of sensing trajectory ($\theta 2$) of the second electrode 133 is steeper than the angle of sensing trajectory ($\theta 1$) of the first electrode 131 ($\theta 1 < \theta 2$).

If it is not car washing as a result of the determination in Step S302, next, in Step S307, the proximity/contact pattern identification unit 29 determines whether or not the human 80 is recognized. More specifically, the proximity/contact pattern identification unit 29 determines whether the respective sensed capacitance values of the first electrode 131 and the second electrode 133 become a state of being stabilized exceeding the threshold value for determination TH1.

If the human 80 can be recognized as a result of the determination of Step S307, since it can be determined that it corresponds to the pattern 1 where the human 80 is in proximity to the door handle 4 in a situation where it is not raining, and then is in contact with the door handle 4 (with an intention of unlocking), the processing goes to Step S308 to be classified into the pattern 1 (decided to pattern 1).

On the other hand, if it is in the car washing as a result of the determination in Step S302, the processing goes to Step S304 to be classified into pattern 2B (in provisional status). Subsequently, the processing goes to Step S307 in order to determine whether or not the human 80 is recognized. Since it can be determined that the car washing is completed and then the human 80 gets in the vehicle (with an intention of unlocking), if the human 80 can be recognized as a result of the determination in Step S307, then the processing goes to Step S308 to be classified as shifting from the pattern 2B to the pattern 1 (decided as shifting to pattern 1 from pattern 2B). Conversely, if the human 80 cannot be recognized in Step S307, the processing goes to Step S309 in order to determine whether or not the human 80 exists (whether or not the electronic key 3 enters within the operation range L2). If the human 80 does not exist as a result of the determination in Step S309, it is determined that the human 80 having gone away after the car washing is completed (without an intention of unlocking), and then the processing goes to Step S310 to complete the processing (decided as in the pattern 2B).

If the human 80 exists as a result of the determination in Step S309, the processing returns to Step S301 to repeat the processing.

On the other hand, if it is raining as a result of the determination in Step S301, then the processing goes to Step S303 in order to determine the intensity of rain falling on the basis of the respective sensing intensities sensed by the first electrode 131 and the second electrode 133.

As a result of Step S303, if the trajectories similar (approximately matched) with each other are observed between the sensing result of the first electrode 131 and the sensing result of the second electrode 133, while each sensing result is instability, it is determined that it is relatively heavy raining, and then it is classified into the pattern 2 in Step S305 (in provisional status).

If it is provisionally classified into the pattern 2 in Step S305, subsequently, the processing goes to Step S307 in order to determine whether or not the human 80 is recognized. If the human 80 can be recognized as a result of the determination of Step S307, since it can be determined that the human 80 gets in the vehicle in relatively heavy raining (with an intention of unlocking), the processing goes to Step S308 to be classified as shifting from the pattern 2 to the pattern 1 (decided as shifting from pattern 2 to pattern 1). If the human 80 cannot be recognized in Step S307, the processing goes to Step S309 in order to determine whether or not the human 80 exists. If the human 80 does not exist as a result of the determination in Step S309, it is determined that only heavy rain is falling (without an intention of unlocking), and then the processing goes to Step S310 in order to complete the processing (decided as in the pattern 2).

If the sensing result of the first electrode 131 and the sensing result of the second electrode 133 are unstable and mismatched to each other as a result of Step S303, it is determined that it is relatively light raining, and then it is classified into the pattern 3 in Step S306 (in provisional status).

If it is provisionally classified into the pattern 3 in Step S303, subsequently, the processing also goes to Step S307 similarly in order to determine whether or not the human 80 is recognized. If the human 80 can be recognized as a result of the determination of Step S307, since it can be determined that the human 80 gets in the vehicle in relatively light raining (with an intention of unlocking), the processing goes to Step S308 to be classified as shifting from the pattern 3 to the pattern 1 (decided as shifting from pattern 3 to pattern 1). If the human 80 cannot be recognized in Step S307, the processing goes to Step S309 in order to determine whether or not the human 80 exists. If the human 80 does not exist as a result of the determination in Step S309, it is determined that only light rain is falling (without an intention of unlocking), and then the processing goes to Step S310 in order to complete the processing (decided as in the pattern 3).

If the human 80 exists as a result of the determination in Step S309, the processing returns to Step S301 to repeat the processing.

The processing returns to FIG. 28 in order to confirm the decided pattern, in Step S209. If the decided pattern is any one of the pattern 1; from the pattern 2 to the pattern 1; from the pattern 3 to the pattern 1; or from the pattern 2B to the pattern 1, the control unit 200 transmits an instruction to the locking control unit 164 to unlock the locking unit 162, in Step S210.

If the decided pattern is any one of the pattern 2, the pattern 3, or the pattern 2B, the control unit 200 transmits an instruction to the locking control unit 164 to keep the locking unit 162 in the locking state, in Step S210.

[Averaging Method Determination Memory]

In Step S108, various kinds of the set value for the averaging method (averaging filter) stored in the averaging method setting memory 27 used by the averaging unit 24 executes removal of a noise, etc. by averaging sampling data, for example, including the following items:

Setting of a parameter to be averaged,
Setting of the number of valid data (simple, the number from the center, the number from the top, the number from the bottom, etc.), and
Sort order (nothing, descending order, ascending order, etc.).

Figure 30:
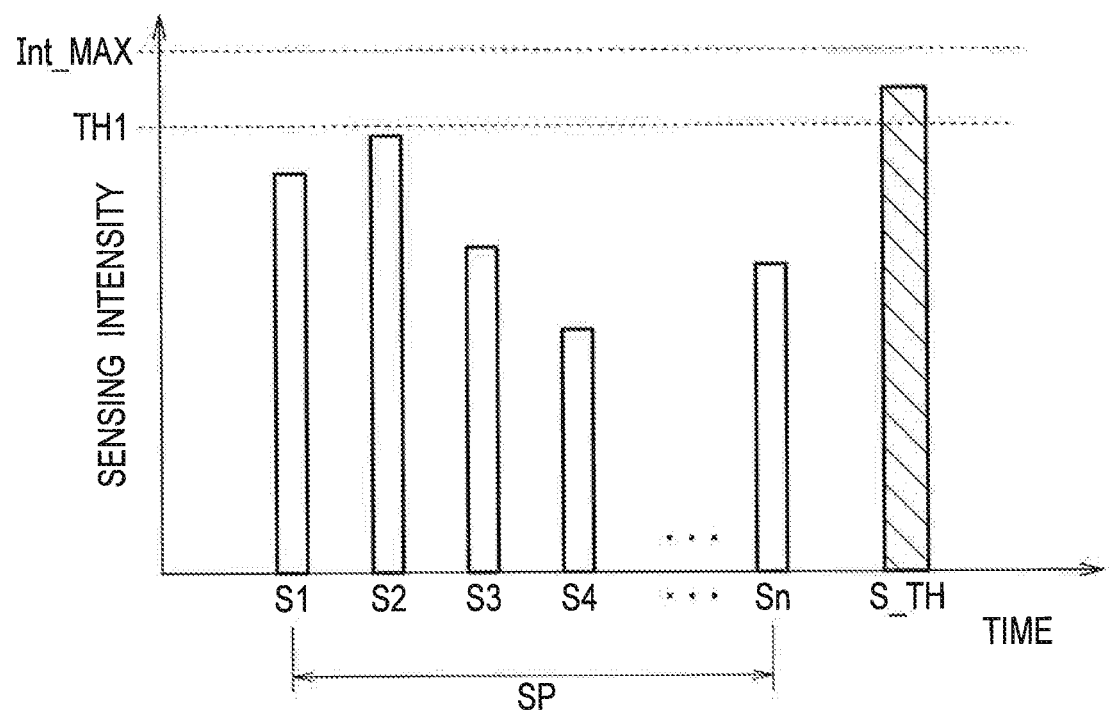
FIG. 30 is a schematic diagram for schematically exemplifying an example of an averaging method executed in the averaging unit of the proximity/contact sensing IC according to the second embodiment.

FIG. 30 schematically exemplifies an example of an averaging method executed in the averaging unit 24 of the proximity/contact sensing IC 18 according to the second embodiment. FIG. 30 shows an example of having n pieces of samples, e.g., a sample 51 to a sample Sn between the sampling period SP, and a sampling interval is several milliseconds, for example.

A median filter, a Gaussian filter, etc. can also be used therefor instead of the averaging filter.

It will now be considered a time period until the human 80 contacts the door handle 4 with regard to recognition of the human 80.

The number of times of sampling becomes 100 times/30 cm, where a time period after the first electrode 131 side senses that the hand 8 is in proximity to the hand 8 until the hand 8 is completely in contact with the door handle 4 is 0.5 second, the distance thereof is 30 cm, and sampling time is 5 milliseconds/time.

Similarly, the number of times of sampling becomes 33 times/10 cm if the distance from which the second electrode 133 side senses the hand 8 is adjusted to 10 cm.

Accordingly, each determination processing of Steps S301, S302, S303, S307, and S309 shown in FIG. 29 is executed during 100 times of the sampling periods.

Thus, the determination unit 25 sets up the threshold value Int_TH on the basis of the sensing result subjected to the averaging etc. by the averaging unit 24, and then stores the threshold value TH in the threshold value setting memory 28, as shown in FIG. 30. Then, the determination unit 25 discriminates whether the human's 80 hand 8 is in contact with the proximity/contact sensing electrode 130 (i.e., door handle 4), or the water droplet is in contact with the proximity/contact sensing electrode 130, on the basis of the threshold value TH1.

As explained above, according to the embodiments, there can be provided: the contact sensing device; the door handle device and the control method for such a door handle device; and the electronic key system, each for preventing a misoperation due to a water droplet adhering to a door handle, e.g. a vehicle, which has an electrostatic locking mechanism, etc., and also capable of reducing a fabricating cost.

Other Embodiments

The first to second embodiments has been described, as a disclosure including associated description and drawings to be construed as illustrative, not restrictive. This disclosure makes clear a variety of alternative embodiment, working examples, and operational techniques for those skilled in the art.

For example, although the first to second embodiments have mainly explained the door handle 4 for vehicles, it is applicable to a variety of doors, e.g. buildings, etc., except for vehicles. When the embodiments are applied to doors except for vehicles, etc., Steps S101 and S102 in the flow chart shown in FIG. 12 may be skipped, and then the processing may be started from Step S103. Similarly, Steps S100, S200, S201, and S202 in the flow chart shown in FIG. 28 may also be skipped, and then the processing may be started from Step S203.

Such being the case, the embodiments cover a variety of embodiments, whether described or not.

INDUSTRIAL APPLICABILITY

The contact sensing device, the proximity/contact sensing device, the door handle device and the control method for such a door handle device, and the electronic key system according to the embodiments can be applied to doors, e.g. buildings, vehicles, etc.

What is claimed is:

1. A proximity/contact sensing device comprising:
a proximity/contact sensing electrode including a first electrode and a second electrode, the first electrode and the second electrode respectively formed so as to be values from which any one or both of an area and sensing sensitivity are different from each other, the proximity/contact sensing electrode configured to sense a proximity or contact to a door;
a reference capacity setting memory storing a reference capacity value for calibration as the sensing maximum;
a comparator unit configured to compare a sensing result sensed by the proximity/contact sensing electrode with the reference capacity value, the reference capacity value stored in the reference capacity setting memory;
a sensing result determinating unit configured to determine whether or not something is in proximity to or in contact with the proximity/contact sensing electrode, on the basis of a comparison result output from the comparator unit;
a proximity/contact pattern identification unit configured to identify the sensing result as a predetermined pattern; and
a determination unit configured to determine whether a water droplet is in contact with the contact sensing electrode or at least a part of a human body is in contact with the proximity/contact sensing electrode, on the basis of the sensing result and a threshold value, the sensing result being identified as the predetermined pattern, the threshold value stored in a threshold value setting memory, wherein
the first and second electrodes are disposed on a mounting substrate,
the first electrode is disposed on an outer periphery of the mounting substrate so as to surround four sides of the second electrode in a plan view, the proximity/contact sensing electrode mounted on the mounting substrate,
a proximity/contact sensing integrated circuit is disposed on the mounting substrate, the proximity/contact sensing integrated circuit comprising the reference capacity setting memory, the comparator unit, the sensing result determinating unit, the proximity/contact pattern identification unit, and the determination unit, and
the first electrode is disposed so as to surround the proximity/contact sensing integrated circuit.

2. The proximity/contact sensing device according to claim 1, further comprising:
an averaging unit configured to execute averaging processing with respect to the sensing result, wherein
the proximity/contact pattern identification unit identifies the sensing result as the predetermined pattern, during the averaging processing is applied by the averaging unit.

3. The proximity/contact sensing device according to claim 1, wherein
the second electrode is disposed on a center portion on the mounting substrate.

4. The proximity/contact sensing device according to claim 1, wherein
a sensing sensitivity of the first electrode is higher than a sensing sensitivity of the second electrode.

5. The proximity/contact sensing device according to claim 1, wherein
an area of the first electrode is wider than an area of the second electrode.

6. The proximity/contact sensing device according to claim 1, wherein
the proximity/contact sensing electrode comprises an electrostatic capacity type proximity/contact sensing electrode.

7. The proximity/contact sensing device according to claim 1, further comprising
an electrostatic switch control integrated circuit and a control circuit, each disposed on the mounting substrate, the electrostatic switch control integrated circuit comprising the proximity/contact sensing integrated circuit, the control circuit configured to control the electrostatic switch control integrated circuit, wherein
the first electrode is disposed so as to surround both the electrostatic switch control integrated circuit and the control circuit.

* * * * *